León Heiting; Melvin Sharp

United States Patent [19]
Hunter et al.

[11] 4,419,746
[45] Dec. 6, 1983

[54] MULTIPLE POINTER MEMORY SYSTEM

[75] Inventors: Arthur C. Hunter, Lubbock; Stephen P. Hamilton, Midland, both of Tex.

[73] Assignee: Texas Instruments Incorporated, Dallas, Tex.

[21] Appl. No.: 196,808

[22] Filed: Oct. 14, 1980

[51] Int. Cl.³ .......................................... G11C 13/00
[52] U.S. Cl. .................................... 365/189; 365/230
[58] Field of Search ............... 365/189, 230, 222, 200

[56] References Cited

U.S. PATENT DOCUMENTS

| 3,402,398 | 9/1968 | Koerner et al. | 365/189 |
| 3,737,879 | 6/1973 | Greene et al. | 365/230 |
| 3,772,658 | 11/1973 | Sarlo | 365/189 |
| 3,900,837 | 8/1975 | Hunter | 365/200 |
| 4,028,675 | 6/1977 | Frankenberg | 365/222 |
| 4,227,798 | 10/1980 | Steiner | 365/222 |

Primary Examiner—Terrell W. Fears

Attorney, Agent, or Firm—René E. Grossman; Leo Heiting; Melvin Sharp

[57] ABSTRACT

A memory system includes a multiple memory pointer in which a pointer selection signal selects one of a plurality of memory pointers to generate an address signal for application to the memory for controlling the location of memory operations. In the preferred embodiment the memory is arranged in an X by Y matrix having X times Y individually addressable memory locations. A first pointer circuit has a plurality of address pointers, one of which is selected for generation of an X coordinate address. A second pointer circuit includes a single address pointer for generation of the Y coordinate address. The second pointer circuit may be a multiple pointer in an alternative embodiment. By provision of a number of individually addressable memories responsive to the same memory pointer system, separate application of address signals from differing address pointers to differing memories permits multiple memory operations in a single instruction cycle.

8 Claims, 27 Drawing Figures

X AND Y ARE MATRIX DECODE POSITION COORDINATES CORRESPONDING TO SELECTED MEMORY LOCATIONS.
* = ADDRESSED MEMORY LOCATION.

| ADDRESS LOCATION | LABLE | STATE |
|---|---|---|
| $X_A^*(0), Y_A^*(3) =$ | AA = | 00 |
| $X_B^*(1), Y_B^*(1) =$ | BB = | 11 |
| $X_A^*(0) Y_B^*(1) =$ | AB = | 01 |
| $X_B^*(1) Y_A^*(3) =$ | BA = | 10 |

TABLE 1

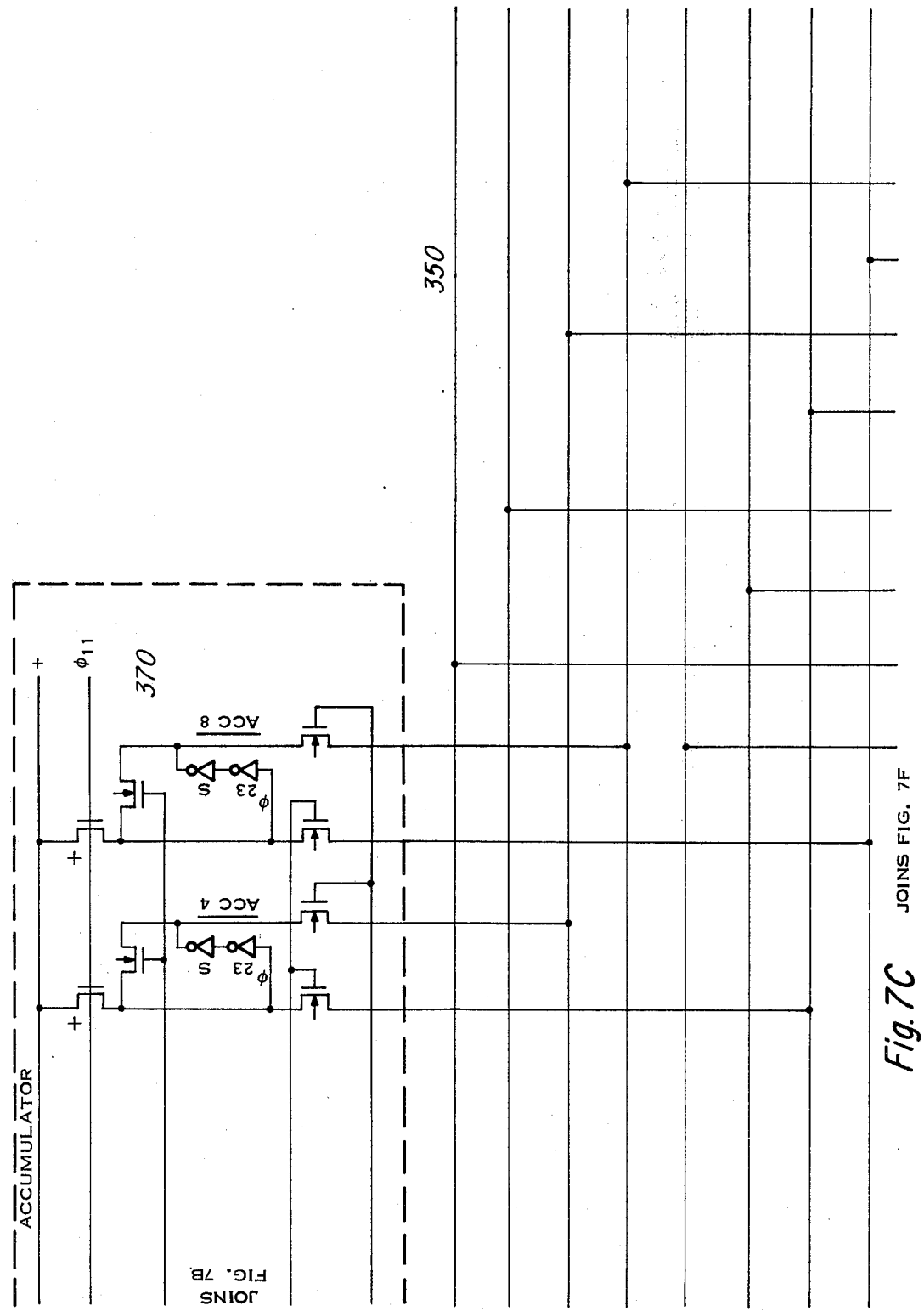

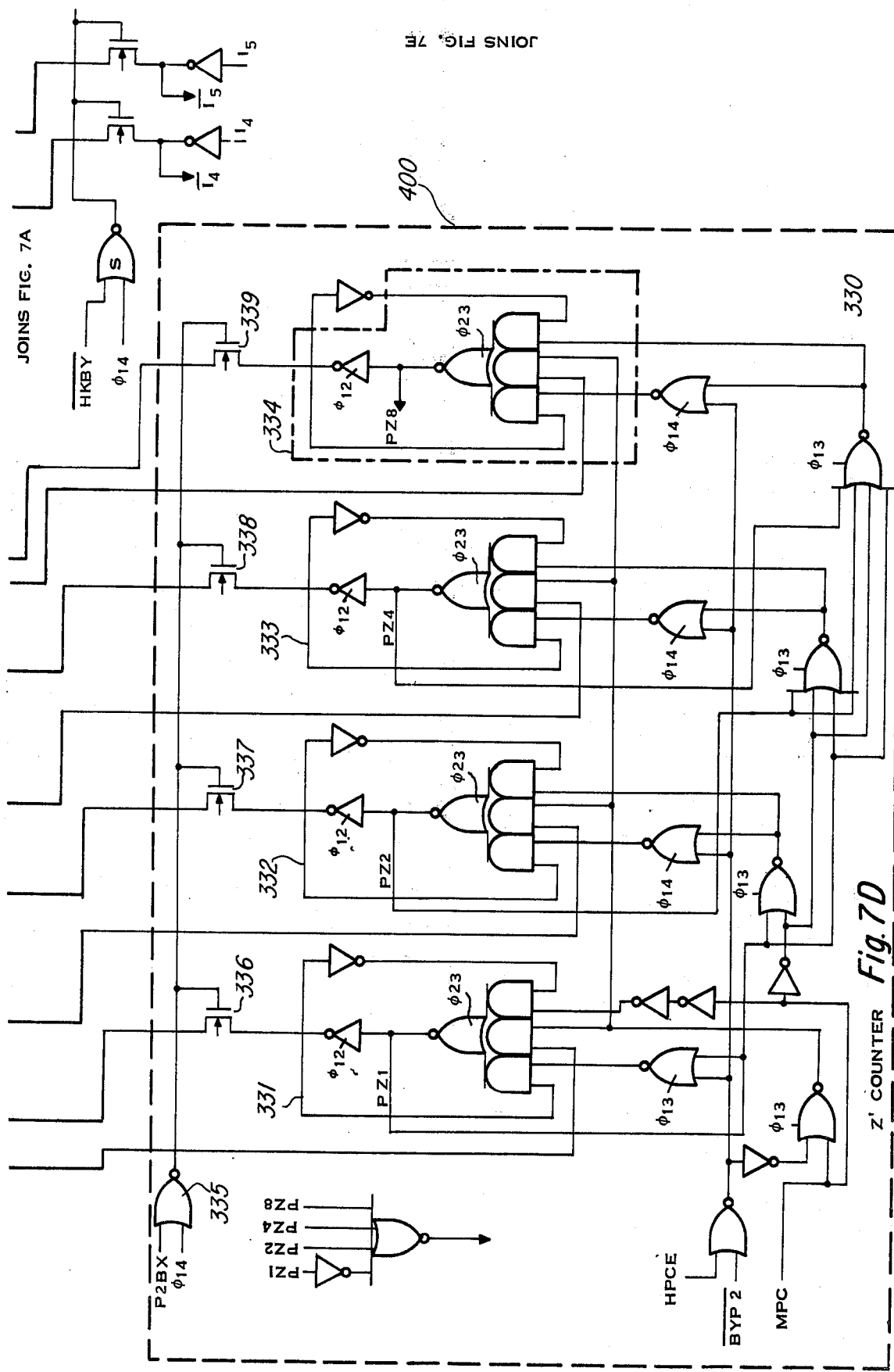

PROCESSOR CLOCKS

1 CLOCK CYCLE

LOGIC LEVELS ARE $V_{DD}$ (HIGH) AND $V_{SS}$ (LOW)

Fig. 9

MAJOR EVENT TIMING

| CLOCK / BLOCK | 011 | 012 | 013 | 014 | 021 | 022 | 023 | 024 |
|---|---|---|---|---|---|---|---|---|
| PROGRAM COUNTER | | | PC INCREMENTED | | | | | |
| ROM | | | PC TO PROM | TO DATA BUS (DB) | | | | ROM WORD VALID |
| INSTRUCTION DECODER | | MICROCODE VALID | | | | | | ROM WORD INTO DECODER |
| RAM | | | | TO DB | | | | DB RAM |
| PX, PY | | | | TO DB | | | DB PX, PY | |
| PZ | | | | TO DB | | | DB PZ | PZ INCREMENTED |
| ALU | | | | DB ALU | | | ALU DB | |
| ACCUMULATOR | | | | TO DB | | | DB ACC. | |
| I/O | | | | DB I/O | | | | |
| STATUS LATCH | | | | | | | | SET/RESET |
| SPECIAL CARRY LATCH | | | | | | | SET/RESET | |

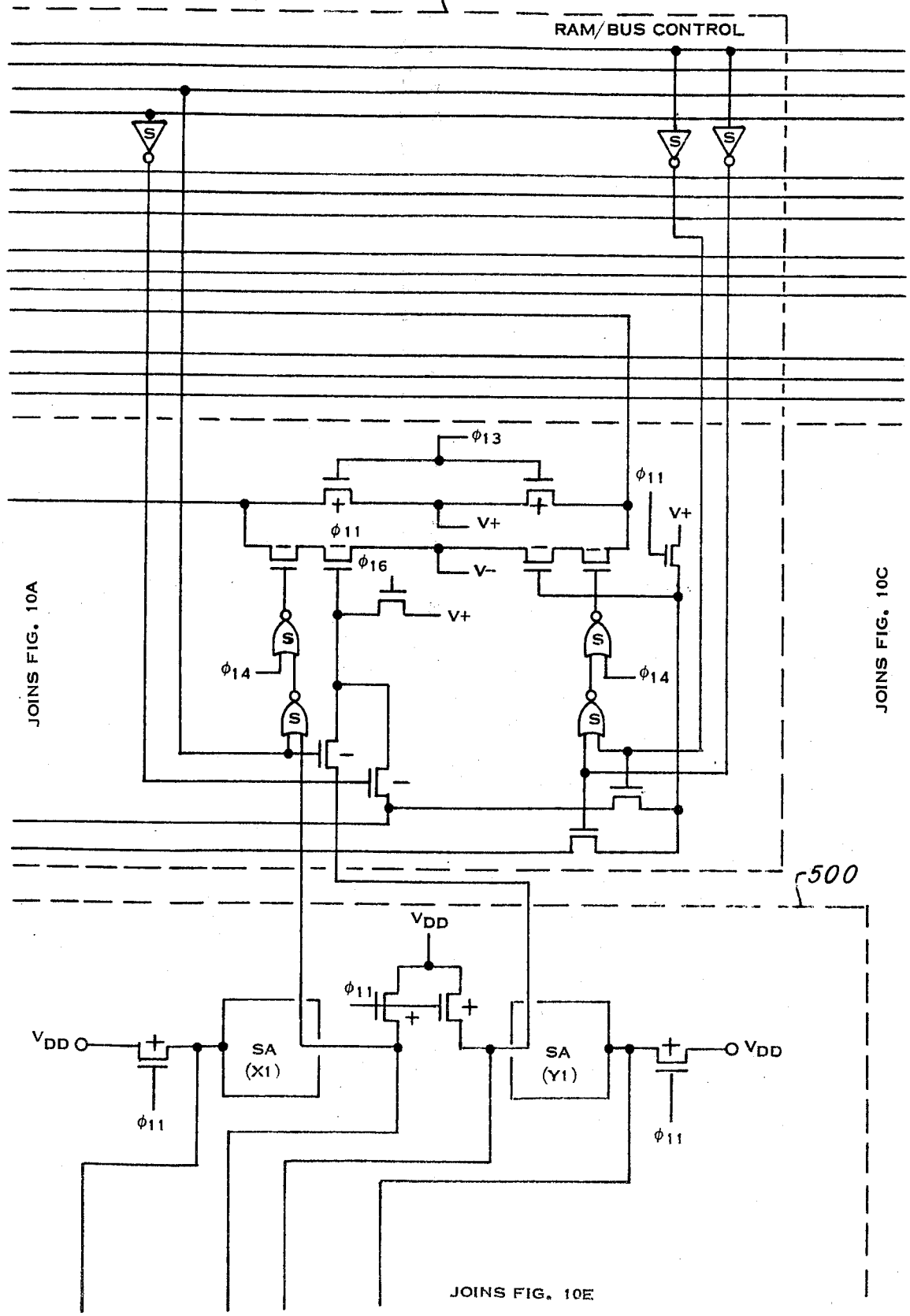

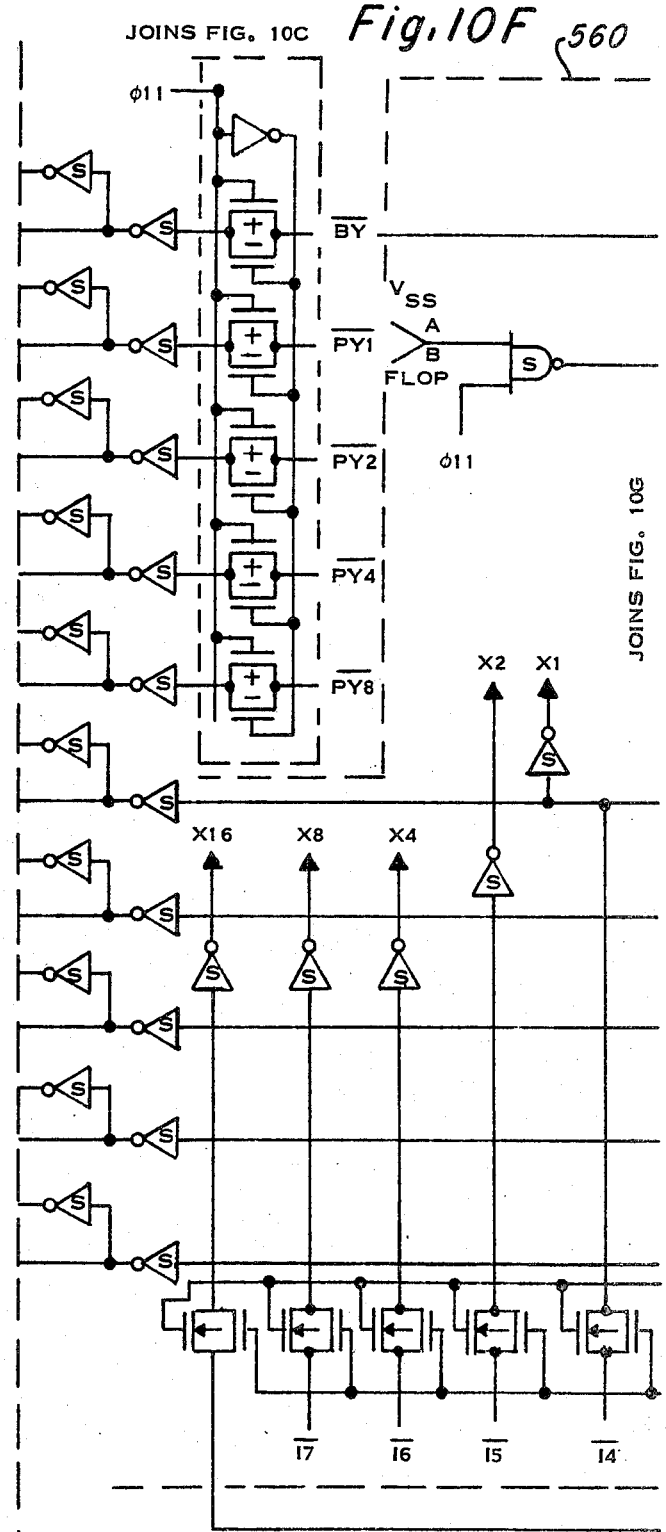

MULTIPLE POINTER MEMORY SYSTEM

BACKGROUND OF THE INVENTION

1. Field of the Invention

This invention relates to a data processing system interface and in particular to a data processing system having a plurality of individual buses between sub-blocks of the system which are selectively reconfigurable, that is, may be isolated and split to form new independent bus paths, and to a multiple pointer memory system which may be used in conjunction with the plurality of individual buses and the bus splitting means.

2. Description of the Prior Art

Prior data processing systems have utilized a plurality of system buses having fixed data communication paths between logic blocks of the data processing system. However, fixed data transfer paths necessarily restrict microinstruction cycle time in a data processing system. Thus, a data processing operation such as adding the contents of a memory location to the contents in the central processing unit (CPU or ALU-arithmetic logic unit) and storing the resultant operand back in a different memory location has previously required either multiple memory cycles which slows the data processing system throughput, or the use of redundant parallel dedicated fixed position data paths, at a cost of increased layout complexity and more difficult interconnect and space requirements. Additionally, in prior systems, where shared dedicated bus structures are utilized, multiple operations on opposite ends of a common bus structure are not possible since the logic blocks attempting to communicate will compete.

It is therefore an object of the present invention to solve the above enumerated problems and others, and to provide a versatile high speed means of performing multiple memory cycles in a given instruction cycle and for performing simultaneous operations between different logic blocks coupled to a splittable common bus.

BRIEF DESCRIPTION OF THE DRAWINGS

The novel features believed characteristic of the invention are set forth in the appended claims. The invention itself, however, as well as further objects and advantages thereof, will be best understood by reference to the following detailed description of an illustrative embodiment when read in conjunction with the drawings, wherein:

Figure 1:
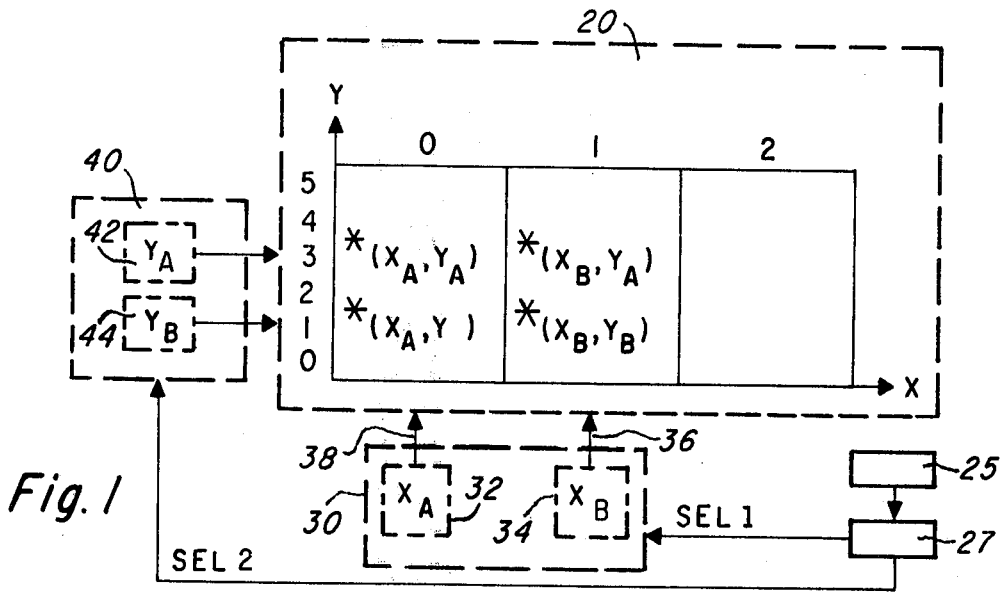
FIG. 1 shows a conceptual block diagram of a memory system having multiple pointers illustrating one aspect of the present invention.
Figure 2:
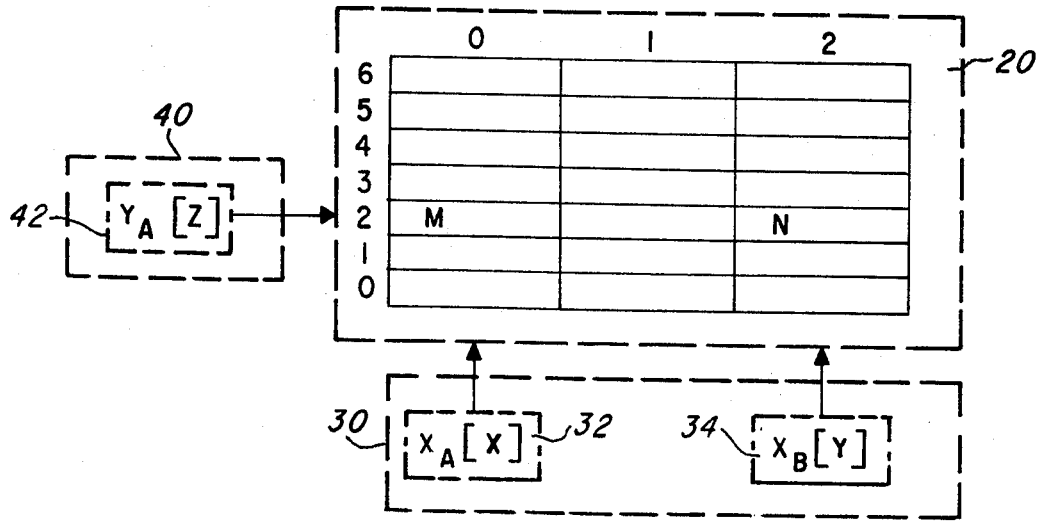
Figure 3:
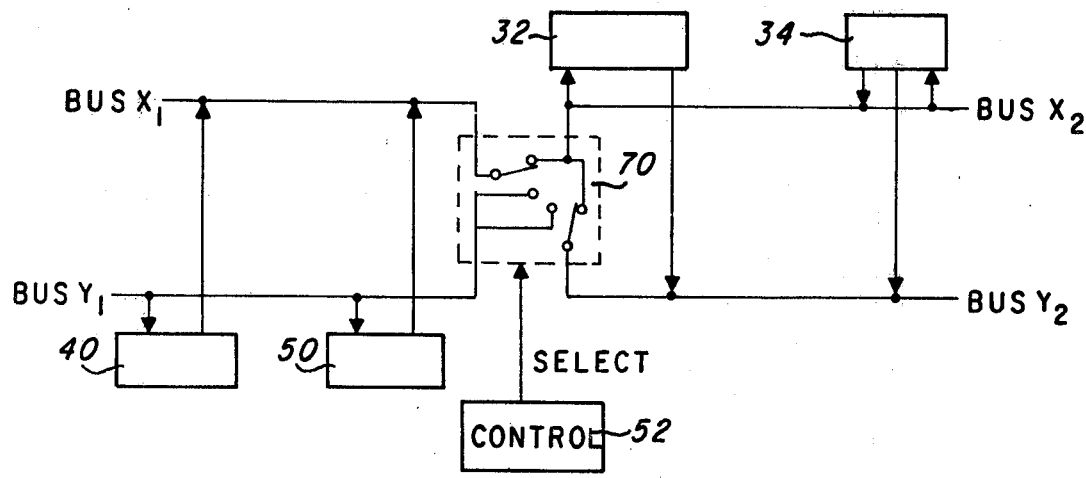
Figure 4:
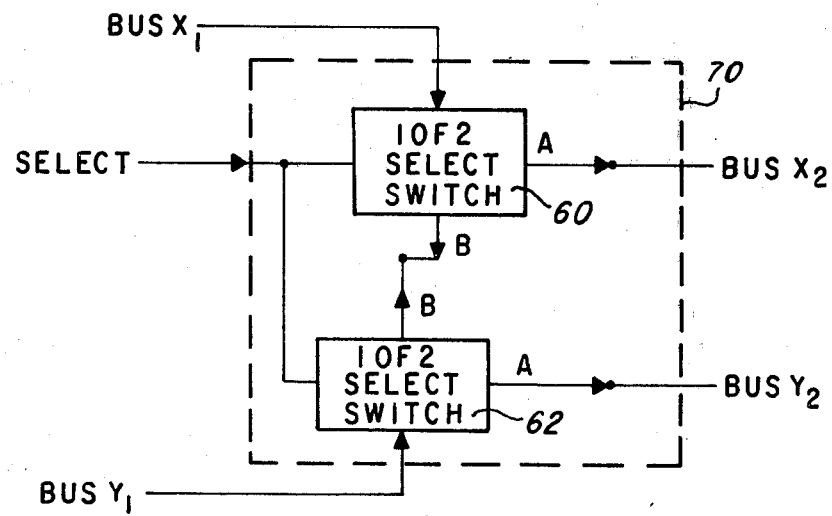
Figure 5:
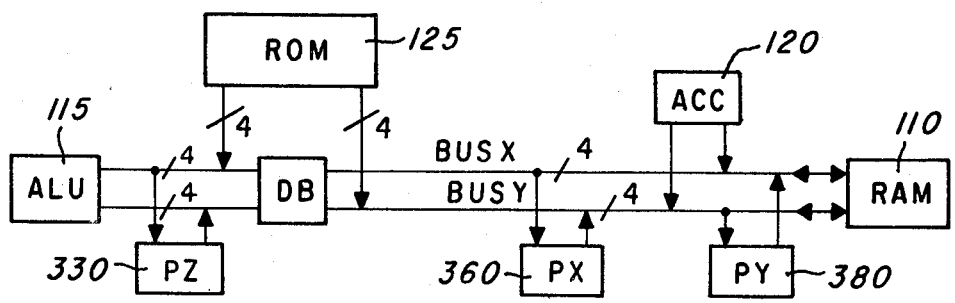
Figure 6:
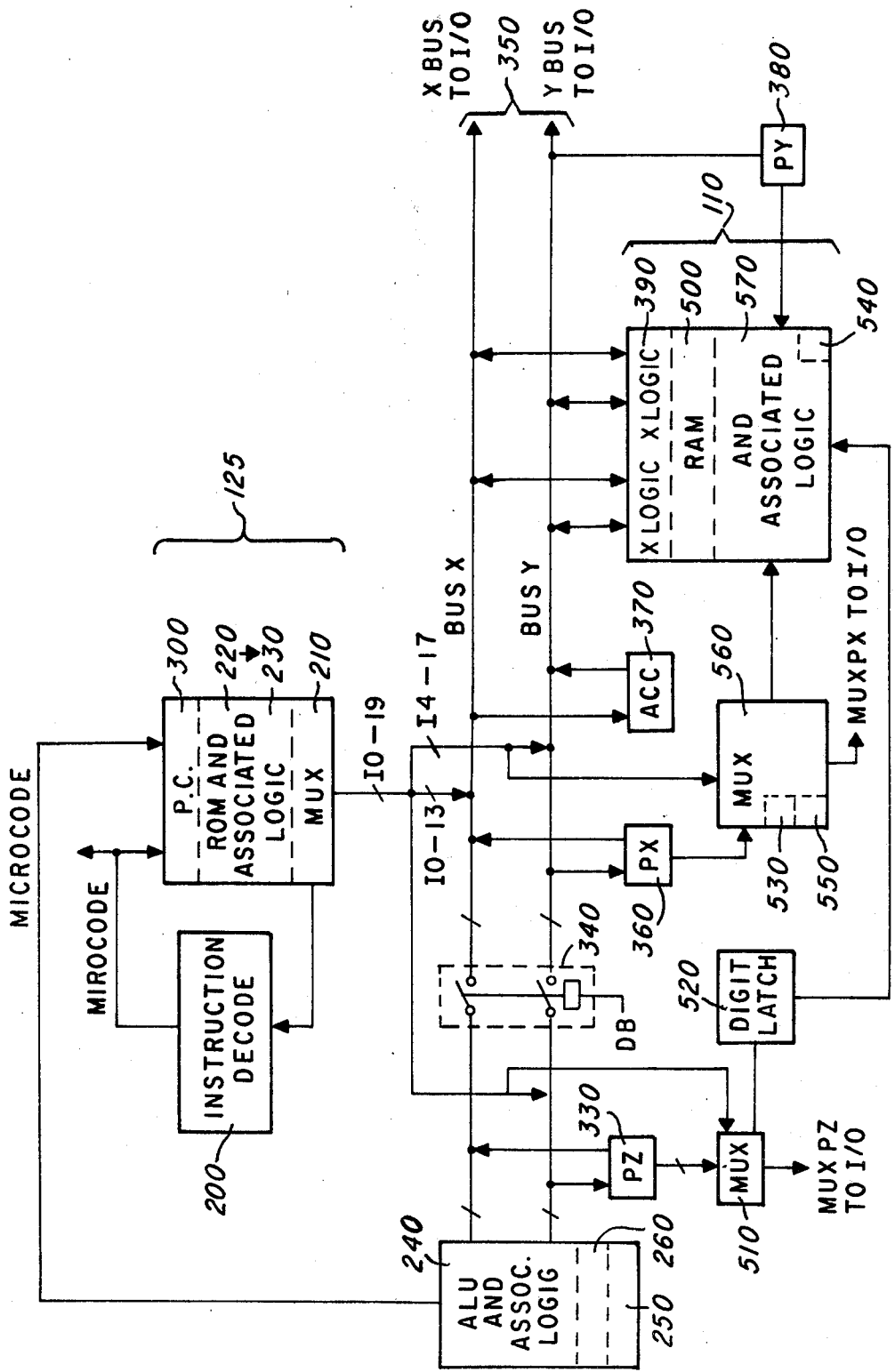
Figure 8:
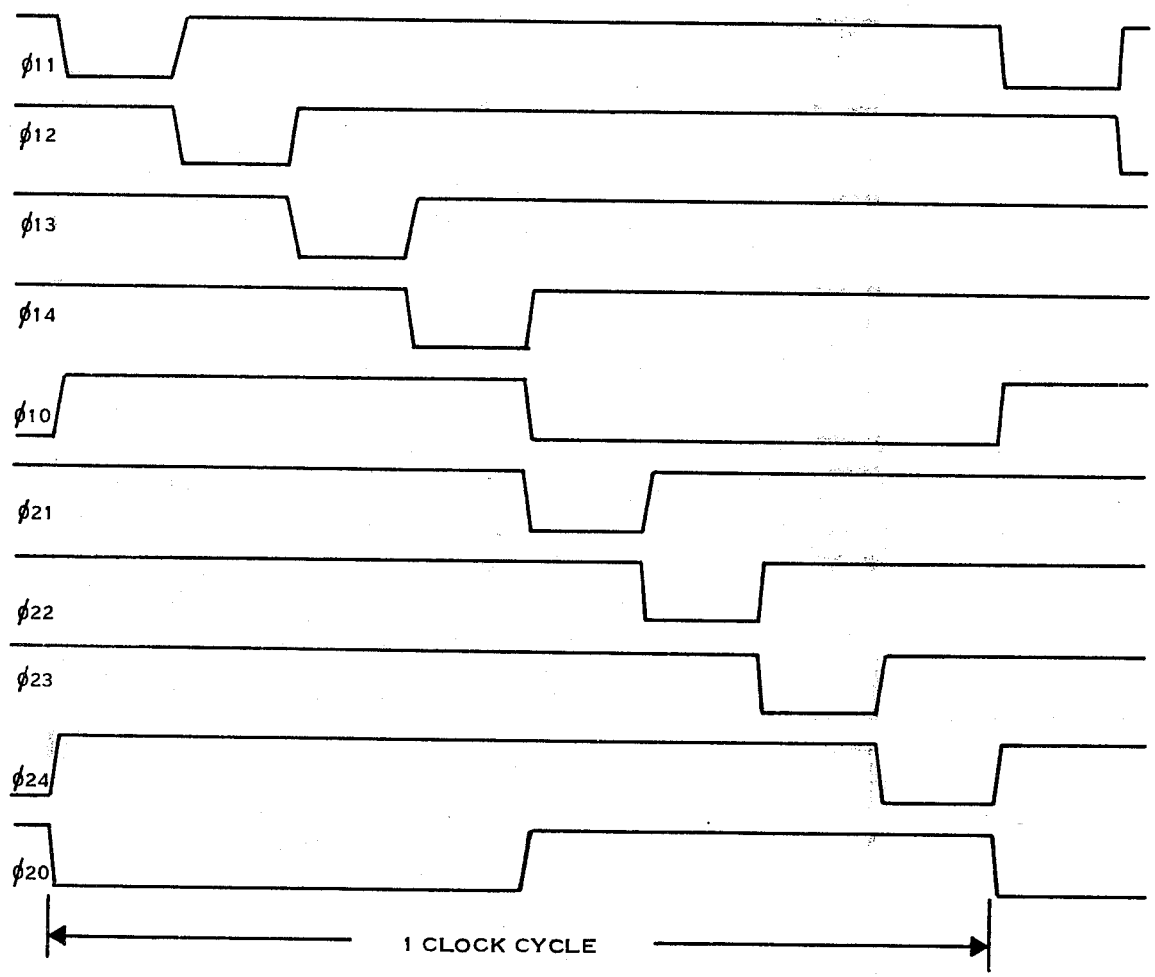
Figure 10A:
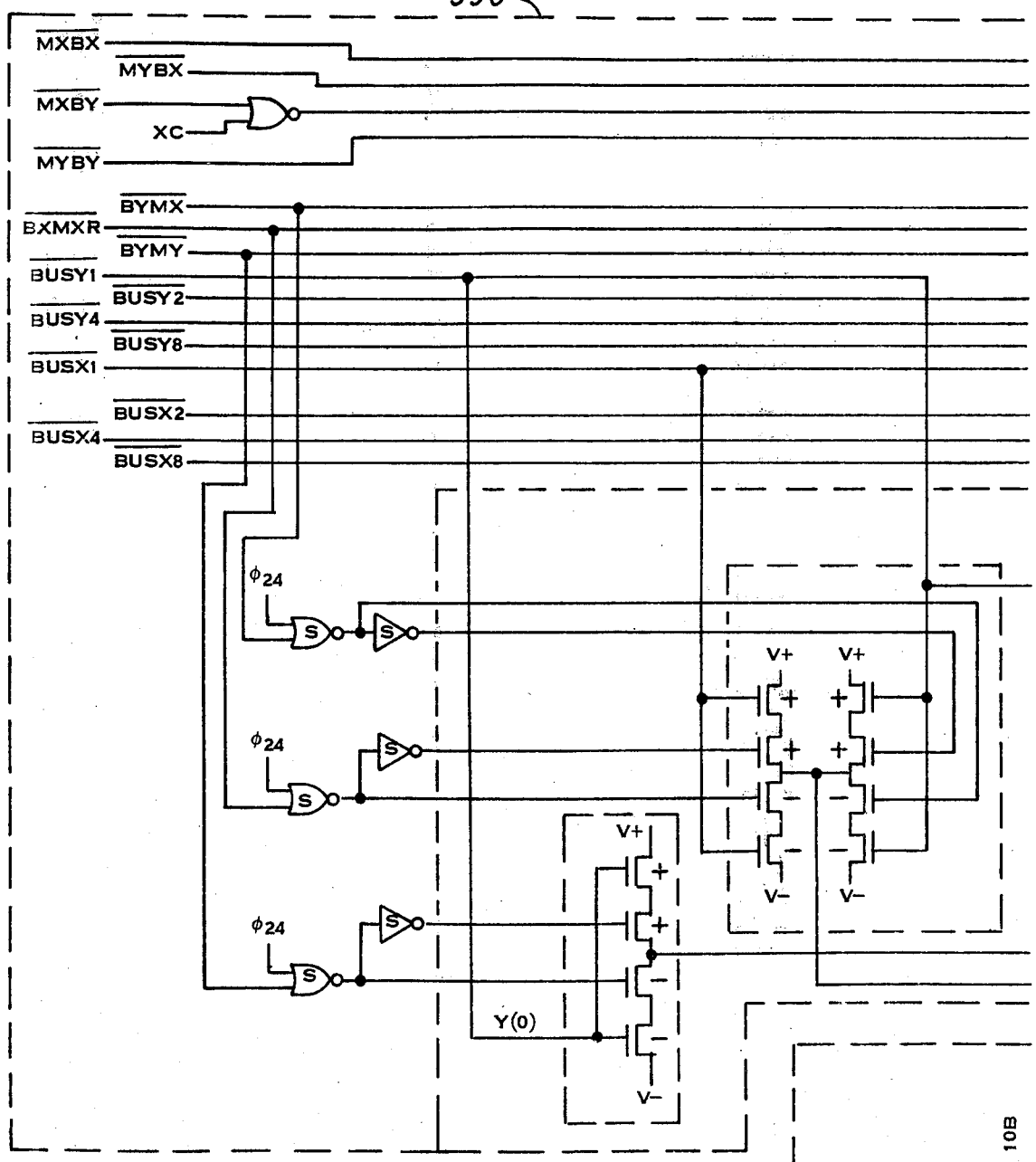
Figure 11:
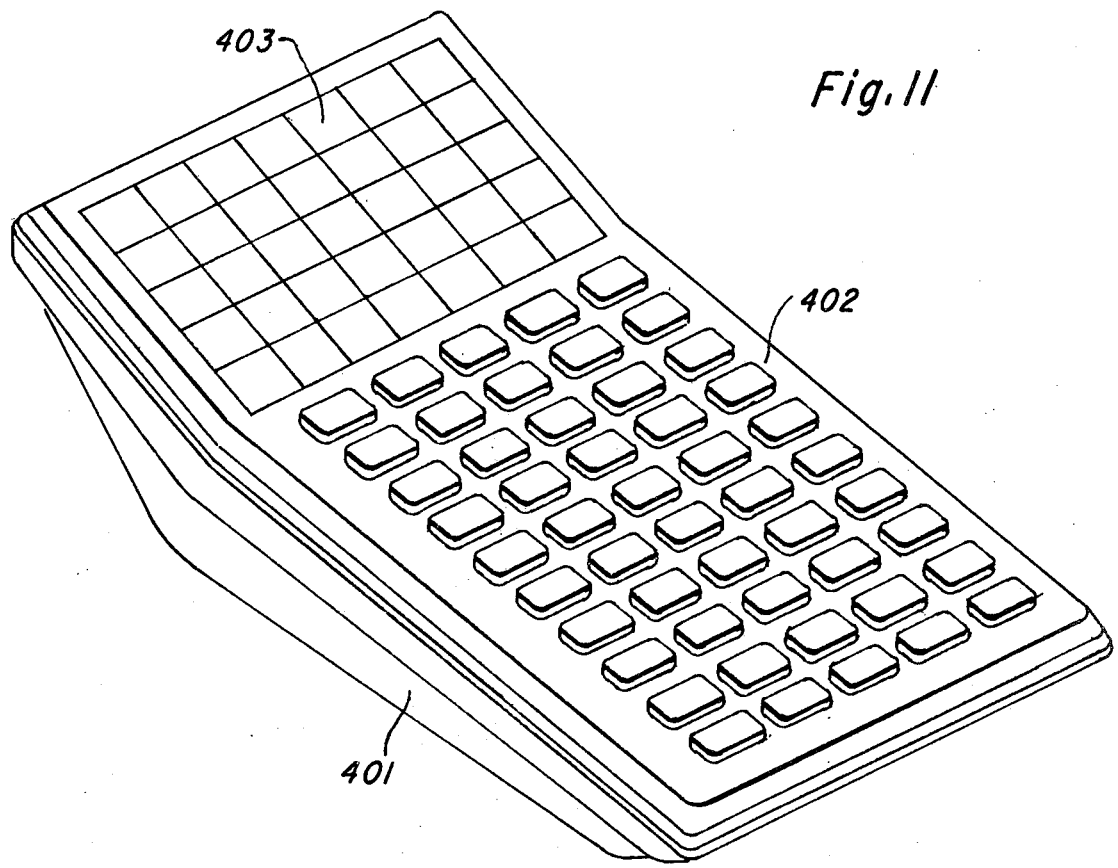
Figure 12:
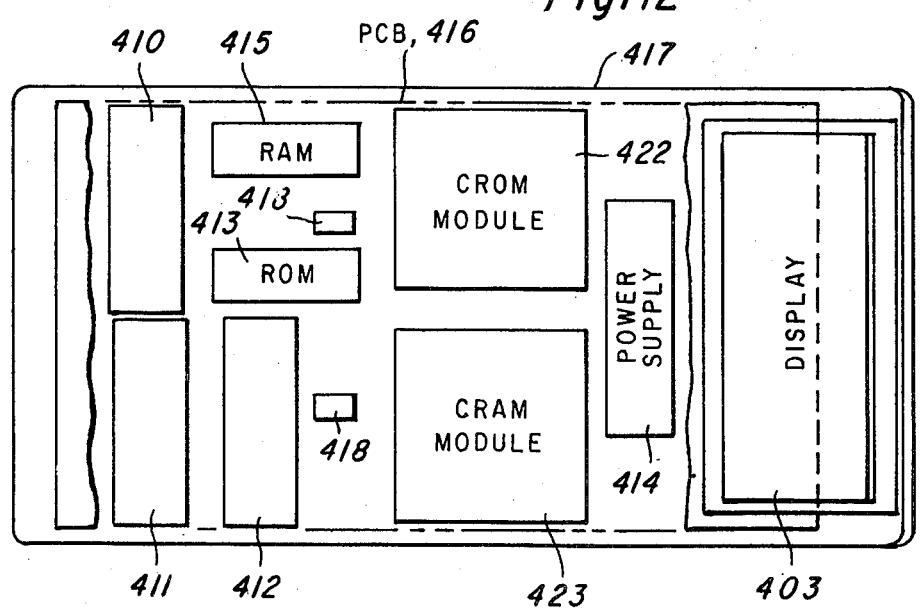
Figure 13:
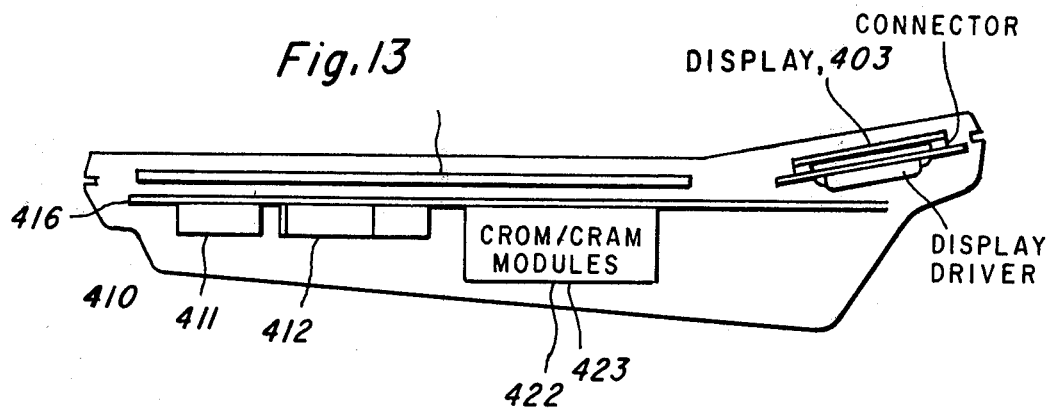
Figure 14A:
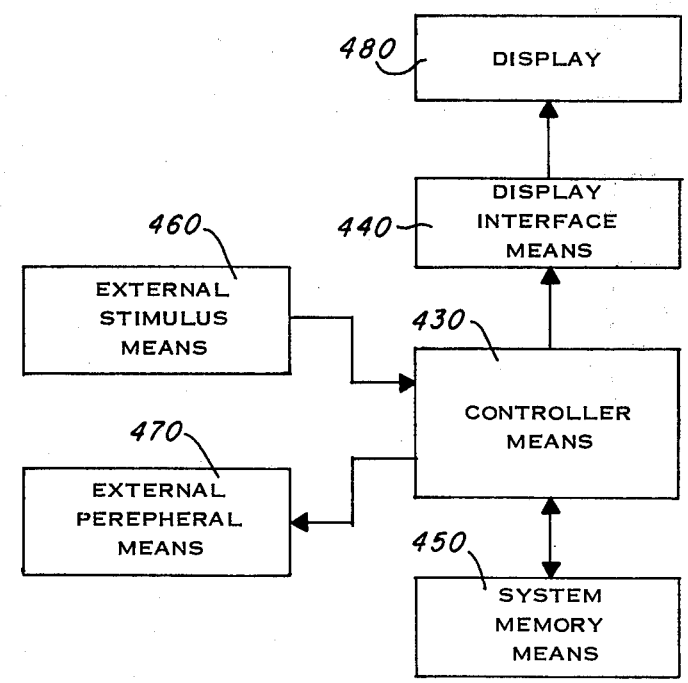
Figure 14B:
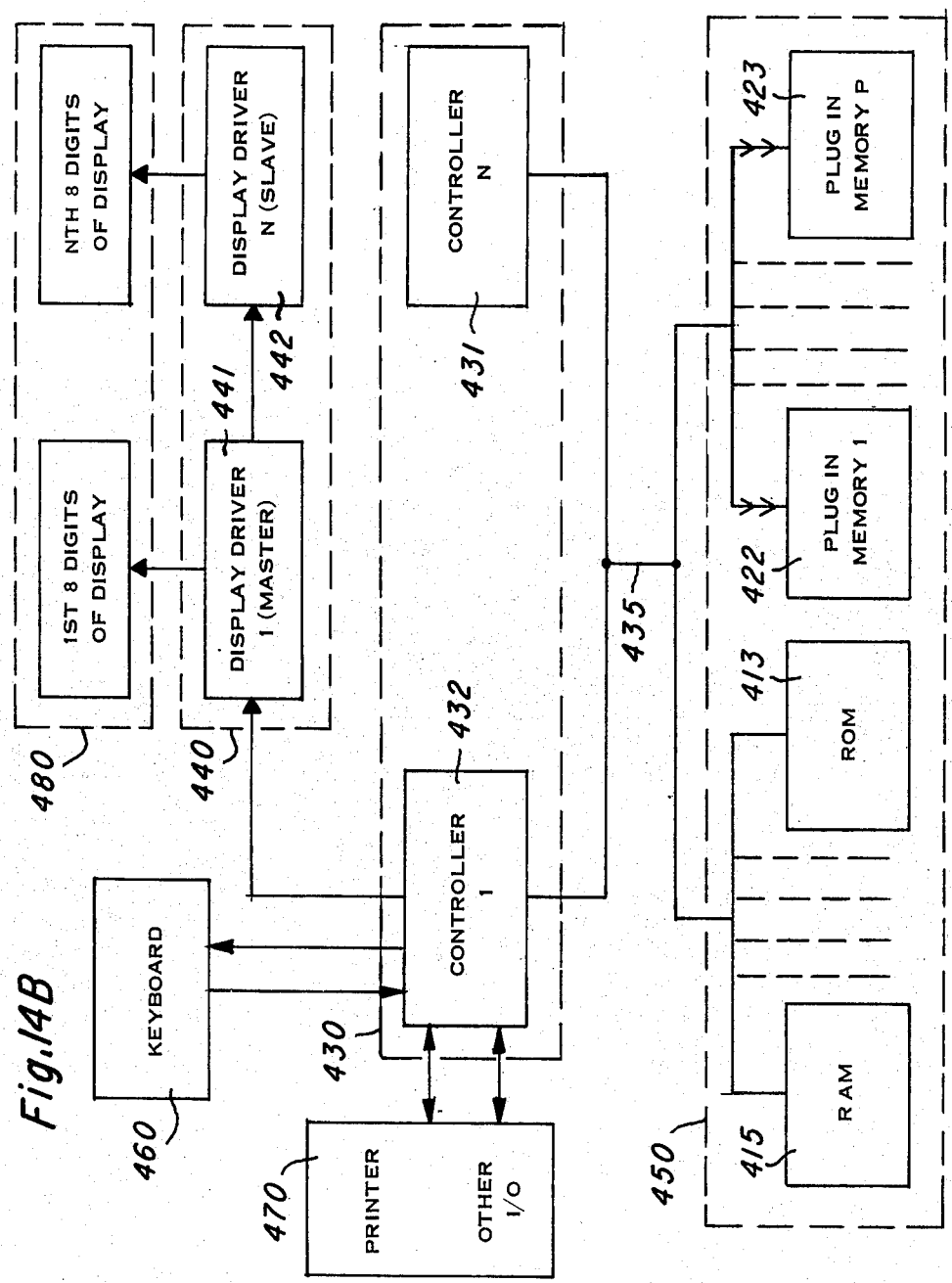
Figure 14C:
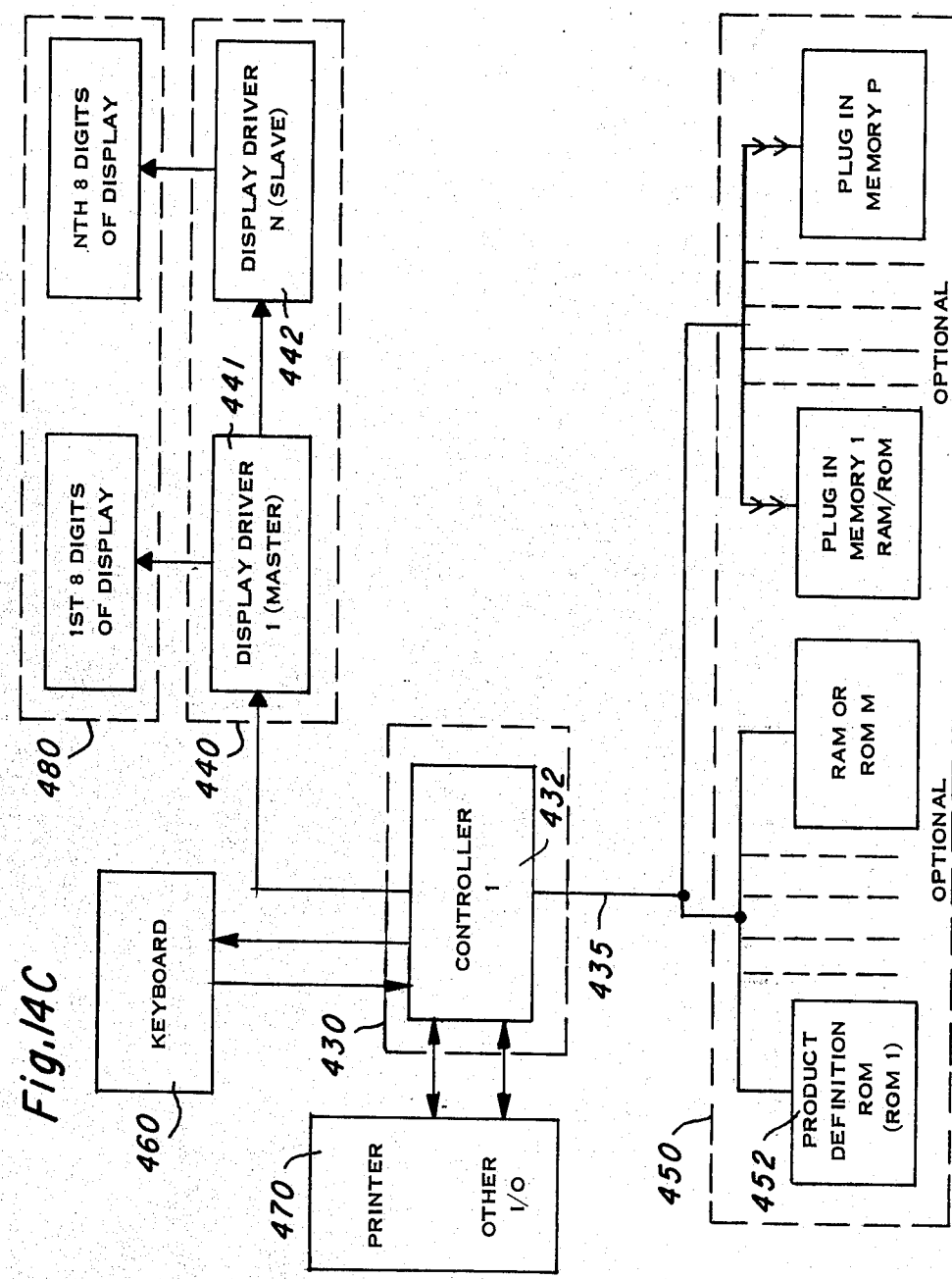

Table 1 is a state mapping table showing the address location within the memory means 20 within FIG. 1 mapped according to the multiple pointers 32 and 34 of the first pointer circuit 30 and multiple pointers 42 and 44 of the second pointer circuit 40, showing the pointer locations corresponding to FIG. 1;

FIG. 2 is a block diagram schematic of a preferred embodiment of the multiple pointer system of FIG. 1;

FIG. 3 is a block diagram of a data processing system having logic blocks, control logic, and bus splitting means, depicting a simplified embodiment of the multiple bus/bus splitting invention;

FIG. 4 is a detailed block diagram of the bus splitting means 70 of FIG. 3;

FIG. 5 is a detailed block diagram of a preferred embodiment of the data processing system of FIG. 3;

FIG. 6 is a detailed block diagram of the preferred embodiment of the data processing system embodying the dual bus/split bus invention and the multiple pointer inventions of the present application;

FIGS. 7A to 7F are detailed schematic drawings of the multiple pointers, accummulator, and bus splitting means of FIGS. 5 and 6;

FIG. 8 illustrates clock timing waveforms for a preferred embodiment of the dual bus multiple pointer system of the present invention;

FIG. 9 is a state mapping diagram referenced to the clock phases of FIG. 8;

FIGS. 10A and 10B are detailed schematic diagrams showing the bus control logic 390 (FIGS. 10A and 10B), the RAM array 500 (FIGS. 10A to 10F), the digit latch 520 (FIG. 10D), the Z multiplexer 510 (FIG. 10D) and associated logic (FIG. 10D), the X multiplexer 560 (FIGS. 10F and 10G) and I/O logic 530, 540 and 550 (FIG. 10G), corresponding to the functional blocks as shown in FIGS. 5-6;

FIG. 11 is a pictoral form of an electronic portable calculator of the type which may employ features of this invention;

FIG. 12 is a bottom view of the calculator 401 of FIG. 11;

FIG. 13 is a side view of the calculator system of FIGS. 11 and 12, detailing the relative placement of the controller chips 410, 411, and 412, the display 403, the keyboard 402, printed circuit board 416 and the memory modules 442 and 423, within the calculator case housing 417;

FIGS. 14A to 14C are block diagrams of alternate embodiments of a modular system design of the present invention.

SUMMARY OF THE INVENTION

A memory system includes a memory for selectively storing and outputting data signals responsive to a received address signal; a controller for providing a control signal; and a pointer including a plurality of address pointers for outputting the address signal from a selected one of the address pointers in response to the control signal. In the preferred embodiment, the memory system includes the memory, having an X by Y memory matrix having X times Y memory word locations, each location having memory cells for storage and output of data signals responsive to an activation signal; a first pointer circuit including a plurality of first pointers for selectively providing a first address coordinate signal output from one of these plurality of first pointers in response to a first pointer select signal; a second pointer circuit for selectively providing a second address coordinate signal output in response to a second pointer select signal; a decode circuit for selectively outputting the activation signal for activating memory cells at a selected memory word X-Y matrix location in response to the first and second address coordinate signals; a selection circuit for providing a selection signal output; and a pointer selection circuit for selectively outputting the first pointer select signal and the second pointer selected signal in response to the selection signal output. Thus, memory word selection may be specified from one location or a multiple of locations simultaneously in the preferred embodiment, the first pointers being X-pointers and the second pointer being a Y-pointer. In an alternate embodiment, the memory system is further characterized in that the second pointer circuit further includes a plurality of second pointers for selectively providing a second address coordinate signal output from one of these plurality of second pointers in response to the second address pointer signal. In the preferred embodiment, the memory system is embodied in a data processing system. In an alternate preferred embodiment, the data processing system is embodied in an electronic calculator.

DETAILED DESCRIPTION

Referring to FIG. 1, a memory system having multiple pointers is shown. The memory system includes memory 20 having an X by Y memory matrix having X times Y memory word locations, each location having memory cells for storage and output of data signals responsive to an activation signal. Each location in said memory means is selectable by a (X,Y) coordinate address. First pointer circuit 30 includes a plurality of first pointers, for example, 32 and 34, for selectively providing a first address coordinate signal output (on lines 36 and 38, respectively) from one of these plurality of first pointers in response to a first pointer select signal, SEL1. The pointer circuit 30 may alternatively provide simultaneous outputs from multiple ones of the first address coordinate output lines 36 and 38. Second pointer circuit 40 selectively provides a second address coordinate signal output in response to a second pointer select signal SEL2. The second pointer circuit (in an alternate embodiment) includes a plurality of second pointers (e.g. 42 and 44) for selectively providing one second address coordinate signal output from one of these plurality of second pointers in response to the second address pointer select signal SEL2. Alternatively, second pointer circuit 40 may output a plurality of second address coordinate signals simultaneously. A decode circuit within the memory 20 is coupled to the pointer circuits 30 and 40 for selectively outputting the activation signal for activating memory cells at the selected memory word X-Y matrix location in response to first and second address coordinate signals. Selection circuit 25 provides a selection signal output coupled to pointer selection circuit 27 which selectively outputs the first pointer select signal SEL1 and the second pointer select signal SEL2 in response to this selection signal output. Memory word selection may be specified from one location or a multiple of locations simultaneously. In the preferred embodiment, the first pointers are X-pointers and the second pointers are Y-pointers.

In the preferred embodiment, the memory system is embodied in a data processing system. In an alternate preferred embodiment, the data processing system is embodied in an electronic calculator.

Referring to Table 1, a state mapping table showing the address location within the memory 20 of FIG. 1 mapped according to the multiple pointers 32 and 34 of the first pointer circuit 30 and multiple pointers 42 and 43 of second pointer circuit 40 are shown for the pointer locations corresponding to FIG. 1. As derived from FIG. 1, and corresponding to label AA or state 00 of Table 1, when pointer $X_A$ and pointer $Y_A$ are both selected, the address location (in the memory) selected corresponding to FIG. 1 would be $X_A(0)$, $Y_A(3)$. Thus, the memory location at X, Y matrix decode position coordinates 0, 3 would be selected if pointers $X_A$ and $Y_A$ are selected by the SEL1 and SEL2 signals, respectively. Labels BB, AB, and BA, correspond to selection of pointers $(X_B, Y_B)$, $(X_A, Y_B)$ and $(X_B, Y_A)$, respectively.

Referring to FIG. 2, a preferred embodiment of the multiple pointer system is shown corresponding to FIG. 1, wherein the plurality of first pointers include a first pointer $X_A$ 32, (or for simplicity purposes referred to as the X pointer), and a second pointer $X_B$ 34 (or for simplicity purposes referred to as the Y pointer). The second pointer circuit 40, in the preferred embodiment, is comprised of a single second pointer $Y_A$ 42, (or for simplicity purposes, referred to as the Z pointer). The operation of the multiple pointers of FIG. 2 in conjunction with the memory system of FIG. 2 parallels the operation of the memory system with multiple pointers of FIG. 1, except that the SEL2 pointer select signal for the second pointer means 40 is in essence an enable signal, there being only one pointer within the second pointer circuit in this preferred embodiment.

Referring briefly to FIG. 5, the first pointer circuit 30 is includes pointer PX, 360, and pointer PY, 380 corresponding to pointers 32 and 34 of FIG. 2, respectively. The pointer PZ 330, of FIG. 5, corresponds to pointer 42 of the second pointer circuit 40 of FIG. 2. The detailed operation of the memory system of FIGS. 1 and 2 may be better understood by reference to the detailed drawings and schematics of FIGS. 5–10, and the description of these figures in the specification, contained later herein.

Referring to FIG. 3, a data processing system having logic blocks 32, 34, 40, 50, control logic 52, and bus splitting circuit 70, is shown having an N-bit wide data word and further comprising a bus means, (e.g. bus X1, bus X2, bus Y1, and bus Y2), this bus comprising a plurality M of individual N bit wide buses, each N-bit bus coupling data words among the logic blocks of the data processing system coupled to that bus. The logic blocks 50 may include memory for selectively storing and outputting these N-bit wide data words responsive to a received address signal. In the preferred embodiment, the additional logic blocks 32, 34 and 40, correspond to the X pointer 32, Y pointer 34, and Z pointer 40, of FIG. 2, respectively, though other logic block types may be coupled to the buses in addition to or instead of some or all of the pointers 32, 34, and 40. The controller 52 provides a first control signal which is coupled to the bus splitting circuit 70, which, responsive thereto, selectively couples together individual ones of these M buses. In an alternative embodiment, the bus splitting circuit 70 and control means 52 may be eliminated, and bus X1 directly coupled to bus X2 and bus Y1 directly coupled to bus Y2, thereby forming a dual bus system without bus splitting capability. In either of the described embodiments of the dual bus system, the data processing system further includes circuits for providing for passage of these N-bit data words from memory 50 to a selected one of the logic blocks coupled along at least one of the plurality of buses in response to a second control signal. In the preferred embodiment, including the bus splitting circuit 70 and controller 52, the second control signal may eminate from controller 52. In the preferred embodiment, the memory includes at least two independently addressable read/write memories and the data processing system further includes circuits for coupling two of the independently addressable read/write data word outputs to at least two of the logic blocks responsive to the control signals. In an alternate embodiment, the system further includes circuits for coupling two of the independently addressable read/write memory data word outputs to a selected one of the logic blocks responsive to the first and second control signals. In the alternate embodiment, utilizing bus splitting circuit 70, the data processing system further includes circuits for transfer of at least one selected N-bit data word from a first one of the logic blocks to a second one of the logic blocks along a first one of the plurality of buses and further includes circuits for transfer of a selected one of the N-bit data words from the second logic block to a third logic block along a selected one of the buses responsive to the first and second control signals. In the preferred embodiment as shown in FIGS. 3 and 4, the bus system includes a dual bus system comprising buses X1, X2, Y1 and Y2, each bus facilitating four bit data word transfer and this dual bus system allows eight bit data word transfer from a read only memory logic block to a separate read/write memory block via the dual bus system in one instruction cycle of the data processing system. The dual bus system can perform memory plus memory operations in one instruction cycle. In the embodiment utilizing bus splitting circuit 70, the split bus feature allows an operation to be performed at one end of the bus isolated and independent from an operation on the other end of the previously coupled bus. In this embodiment, the bus splitting circuit 70 couples bus X1 to bus Y1 and couples bus X2 to bus Y2, isolating bus X1 from bus X2 and isolating bus Y1 from bus Y2. This forms two independent isolated N-bit wide buses (4 bit wide in the preferred embodiment) for use independently by logic blocks coupled to each of these independent buses. In the preferred embodiment, the memory pointer circuit, the accumulator logic block, the arithmetic logic block and the memory (read-only and read write) logic blocks, are all coupled to at least one of these buses within the bus system. A preferred embodiment of the dual and split bus invention is shown in FIG. 5, and an alternate preferred embodiment is shown in FIG. 6. The bus splitting circuit 70 of FIG. 3 is shown in detailed block diagram form in FIG. 4. Responsive to the select signal (first control signal) as output from controller 52, the bus splitting circuit 70 selectively and alternatively couples bus X1 to bus X2 and bus Y1 to bus Y2, or bus X1 to bus Y1 and bus X2 to bus Y2, corresponding to the select signal being at a first logic state or at a second logic state, respectively. The bus splitting circuit 70 includes a first switching circuit 60 which has a one of two select switch and a second switching circuit 62 which also has a one of two select switch. The operation of the bus splitting circuit 70 of FIGS. 3 and 4 is described in greater detail with reference to FIGS. 5-10, and is shown in detailed schematic form in FIG. 7A, circuit block 340.

Referring to FIG. 5, the data processing system in the preferred embodiment, each of the main processor or controller integrated circuits in a data processing system as shown in FIGS. 14A-14C has a dual bus configuration comprising two separate data buses X and Y, each bus X and bus Y having four parallel data paths extending between the read-write memory (RAM) 110 and the arithmetic logic unit (ALU) 115. Three memory pointers PX, PY and PZ corresponding to the pointers of FIGS. 1 and 2 and an accumulator 120 are coupled to the buses X and Y. Each of the pointers PX, PY and PZ, and the accumulator 120, are selectively coupled to and read from one of these two buses, and are selectively coupled to and write onto (outputs data signals onto) the other data bus, thereby expediting the transfer of information among the logic blocks coupled to the buses. In the preferred embodiment, pointers PX and PY also function as register pointers, having capabilities for simultaneously addressing two different registers in the RAM 110 while the PZ pointer functions as a digit pointer for addressing a particular word or digit in the RAM 110. The use of three pointers allows access to two different locations, (X, Z) and (Y,Z) in the RAM 110 at the same point in time and, together with the dual four bit configuration, provides for faster and more efficient data transfer than that achieved in prior art digital processors in which a single data bus and two memory pointers are used. The dual bus configuration allows memory plus memory operations, and transfers back to memory, in one instruction cycle. For example, four bits of data from the ROM 125 and four bits of data from the RAM 110 may be added in the ALU logic block 115 and the result sent back to and stored in the RAM 110, all in one instruction cycle. Additionally, the configuration permits the direct memory addressing of the RAM 110 with eight bits of data. Thus, the system provides the speed and efficiency of a register processor machine with the flexibility and versatility of a digit processor machine. In the preferred embodiment of the bus configuration described herein, each of the buses may be split into two separate portions, thereby isolating the ALU 115 from the RAM 110 and allowing separate operations to be performed independently on each side of the bus splitting circuit, as described with reference to FIGS. 3 and 4. This features adds further versatility to the system by increasing the number of operations which can be performed during a single instruction cycle.

Referring to FIG. 6, the output signals from the ROM system 125, which includes ROM and associated logic 220, program counter 300, and multiplexer 210, form bus inputs which are transmitted to the bus in response to a sequence of microcode signals as output from instruction decode circuit 200. Bus Y is coupled to receive bus inputs I0-I3 when the microcode signal KBY is at a zero logic level and is coupled to receive the bus inputs I4-I7 when the microcode signal AK3 is at zero logic level. Similarly, bus X is coupled to receive bus inputs I0-I3 when microcode signal KBX is at a zero logic level. The bus splitting circuit 340 in essence creates two independent sets of dual buses, each dual bus isolated from the other, such that dual bus operations may be performed along either set of dual buses along each side of the bus splitting circuit 340 independent of the use of the other set of dual buses. This allows simultaneous use along each side (e.g. the right side bus and left side bus) of the discontinuity of the dual bus structure. This function is particularly useful for loading an output data word from the ROM 125 to the RAM 110 via the right side of the data bus while simultaneously incrementing the Z counter 330 by outputting the present contents of the Z pointer onto bus of the left side bus, coupling this counter output to the ALU 240, incrementing the received data value in ALU 240, and providing an output onto the left side bus, this incremented output being coupled to and loaded into the Z pointer 330. The bus splitting circuit thus allows simultaneous execution of events which would otherwise be sequential, thus effectively increasing the single instruction complexity level capabilities, and reducing the instruction word storage requirements in the ROM 125. An additional advantage provided by the dual bus structure is a reduction in the complexity of the microcode in timing of the overall system. By each logic block in the system coupling its output to one of the dual buses, and coupling its input (or its second output in the case of the ROM 125), the microcode control and timing necessary to implement the transfer of data out of a logic block into another logic block and back to any other logic block is reduced in complexity.

Referring to FIGS. 7A to 7F, pointer PZ 330, is coupled to the bus X and bus Y so that it reads from bus Y and writes onto bus X. When the microcode signal BYPZ goes low (zero logic level), information is loaded into the pointer PZ 330, from the bus Y, to set pointer PZ 330, so as to address a particular word in the RAM memory 110 when the microcode signals BYP, HPC, and PHCE are low. The RAM memory 110 is comprised of X and Y decode logic 390, read-write memory 500, and associated logic 540 and 570. Outputs PZ1, PZ2, PZ4 and PZ8, from the four sets of logic gates 331, 332, 333, and 334, of FIG. 7B, respectively, as output from PZ 330, are complement signals of the respective signals received from the bus lines from bus Y. PZ counter/pointer outputs PZ1, PZ2, PZ4 and PZ8 represent the encoded address of the particular word/digit location being addressed. Pointer PZ is responsive to the data received from bus Y for addressing a particular word location in the RAM 125 or the pointer PZ may be used as a counter or pointer in conjunction with any of the data processing functions in the data processing system. When the microcode signal PZBX is at a zero logic state, the NOR gate 335 generates a logic one signal which turns on transistors 336 to 339, thereby transmitting (outputting) the pointer PZ address signals PZ1, PZ2, PZ4, and PZ8 to the bus X.

A nearly identical arrangement is used to set pointers PX and PY to address particular registers in the RAM 125. Pointer PX 360, reads from the bus Y and writes onto the bus X. When the microcode signal BYPX is at a low logic level, transistors 361, 363, 365, and 367 are turned on, thereby loading information from bus Y into the pointer PX to set the pointer PX to address a particular register location within the RAM 125. When the microcode signal PXBX is low, transistors 362, 364, and 368 are thereby turned on, thereby coupling pointer PX to the bus Y. When microcode signal BXPY is low, transistors 381, 383, 385 and 387 are turned on, thereby coupling information from bus X into pointer PY corresponding to a particular register location address. When microcode signal PYBY is at a low logic level, transistors 382, 384 and 386 are turned on, thereby transmitting address information from the pointer PY to the bus BY. When microcode signal BXPY is at a low logic level, transistors 381, 383, 385 and 387 are turned on, thereby coupling address information from bus X to be loaded into pointer PY 380. Data is stored in and output from accumulator 370 as shown in FIGS. 7B and 7C, in a manner similar to that described for pointers PX 360 and PY 380. Accumulator 370 receives data from bus X when the microcode signal BXAC is high, and the accumulator 370 transmits data (outputs) to bus Y when microcode signal ACBY is at a low logic level.

Figure 7A:
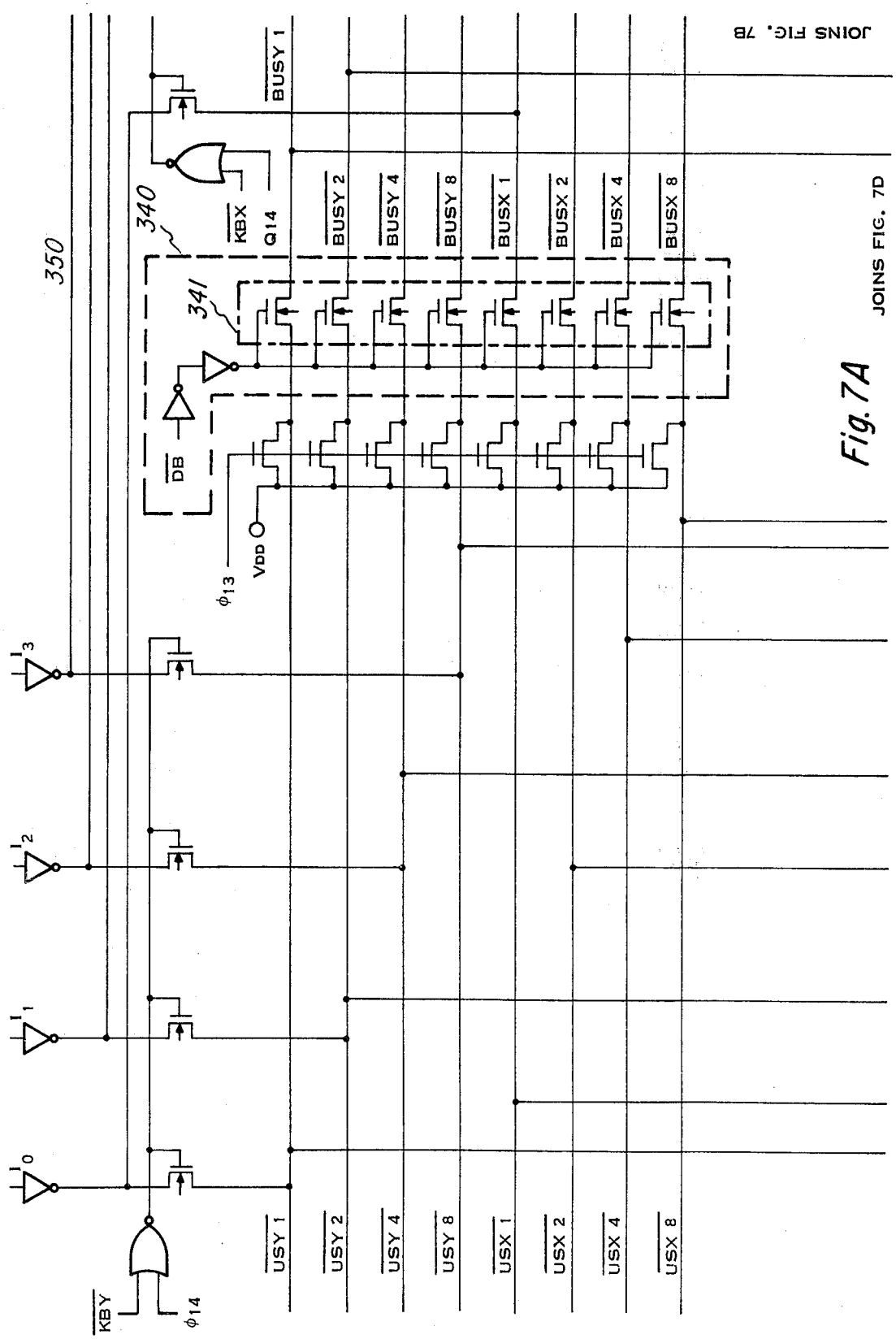
Figure 7B:
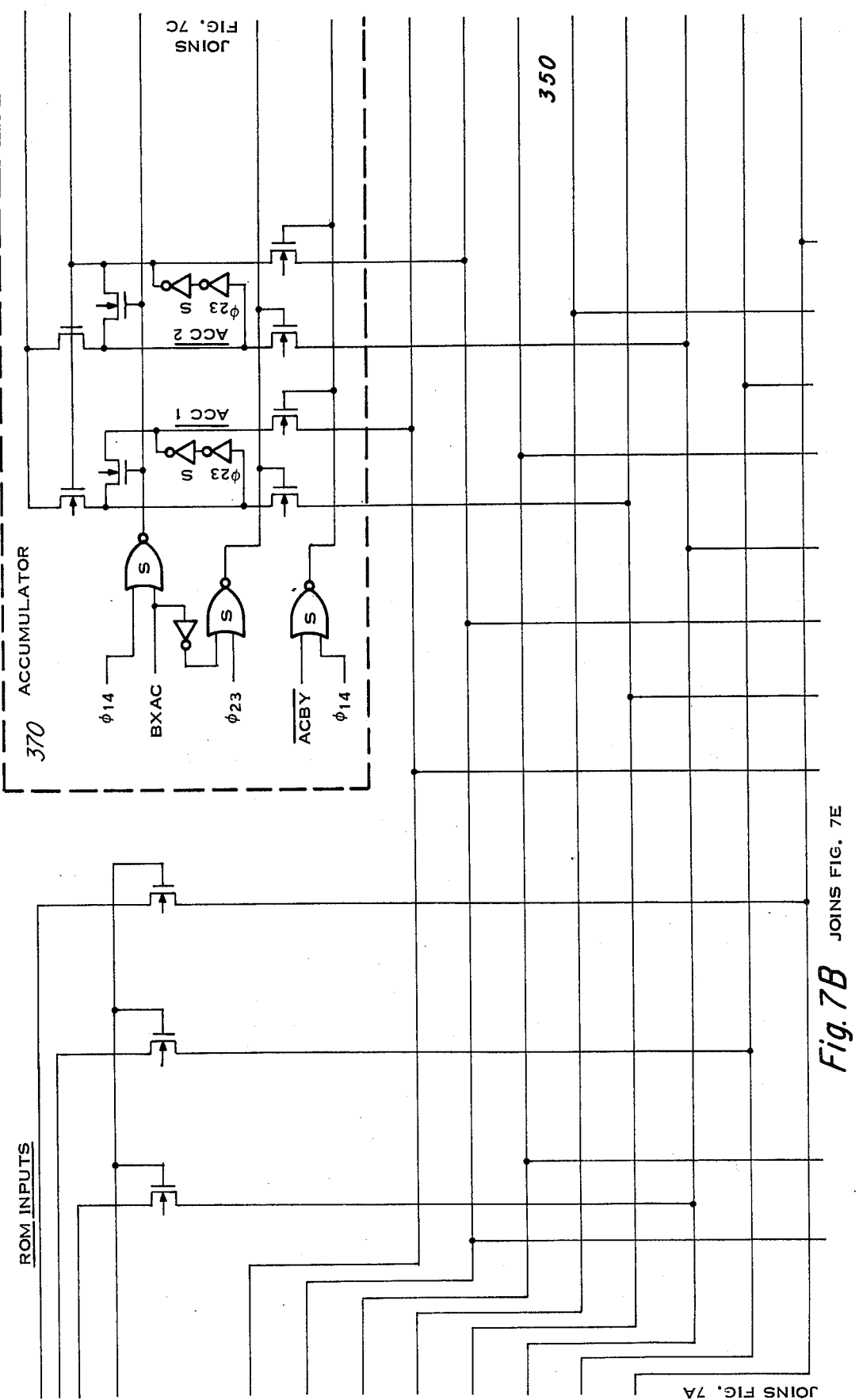
Figure 7E:
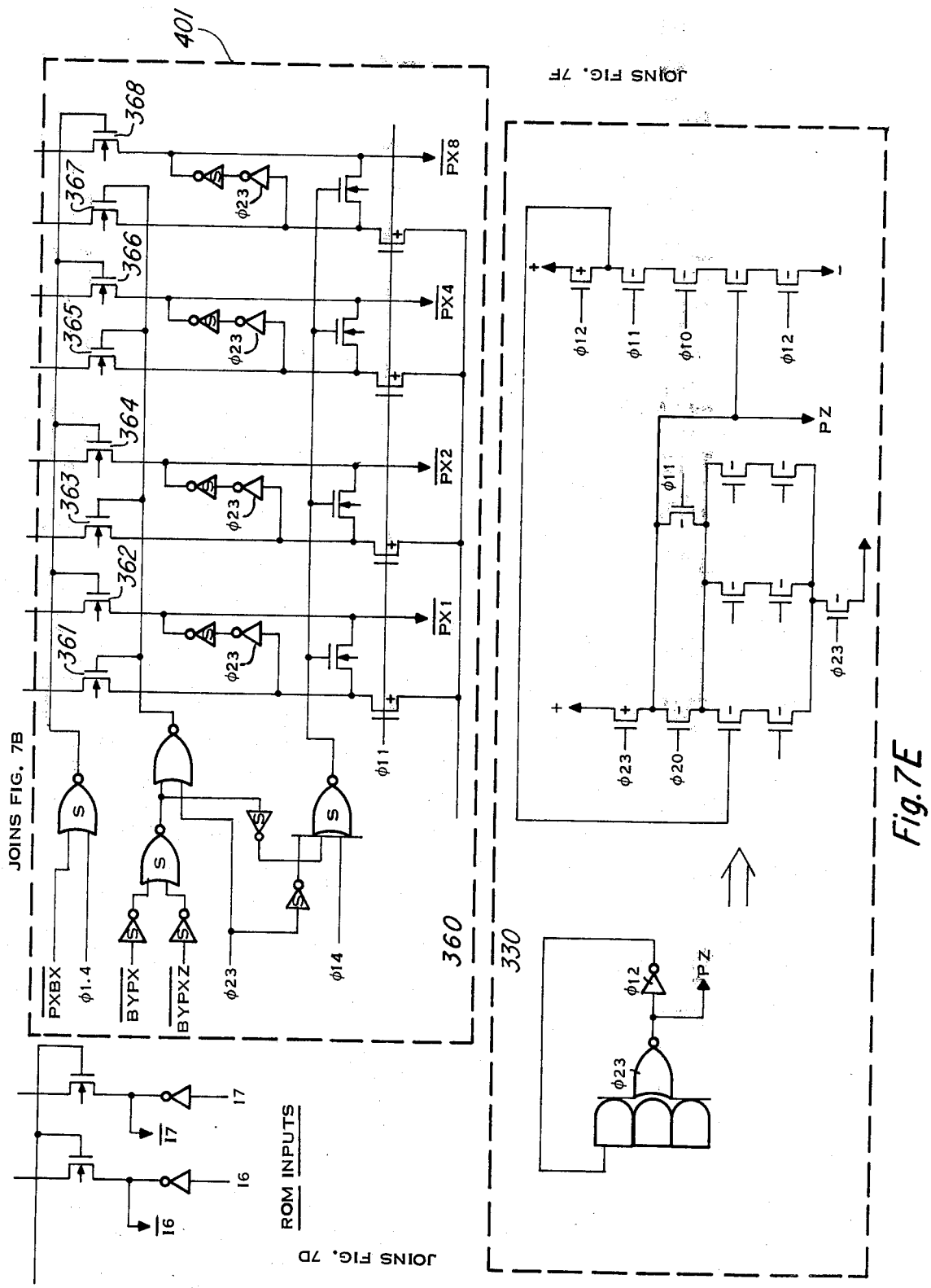
Figure 7F:
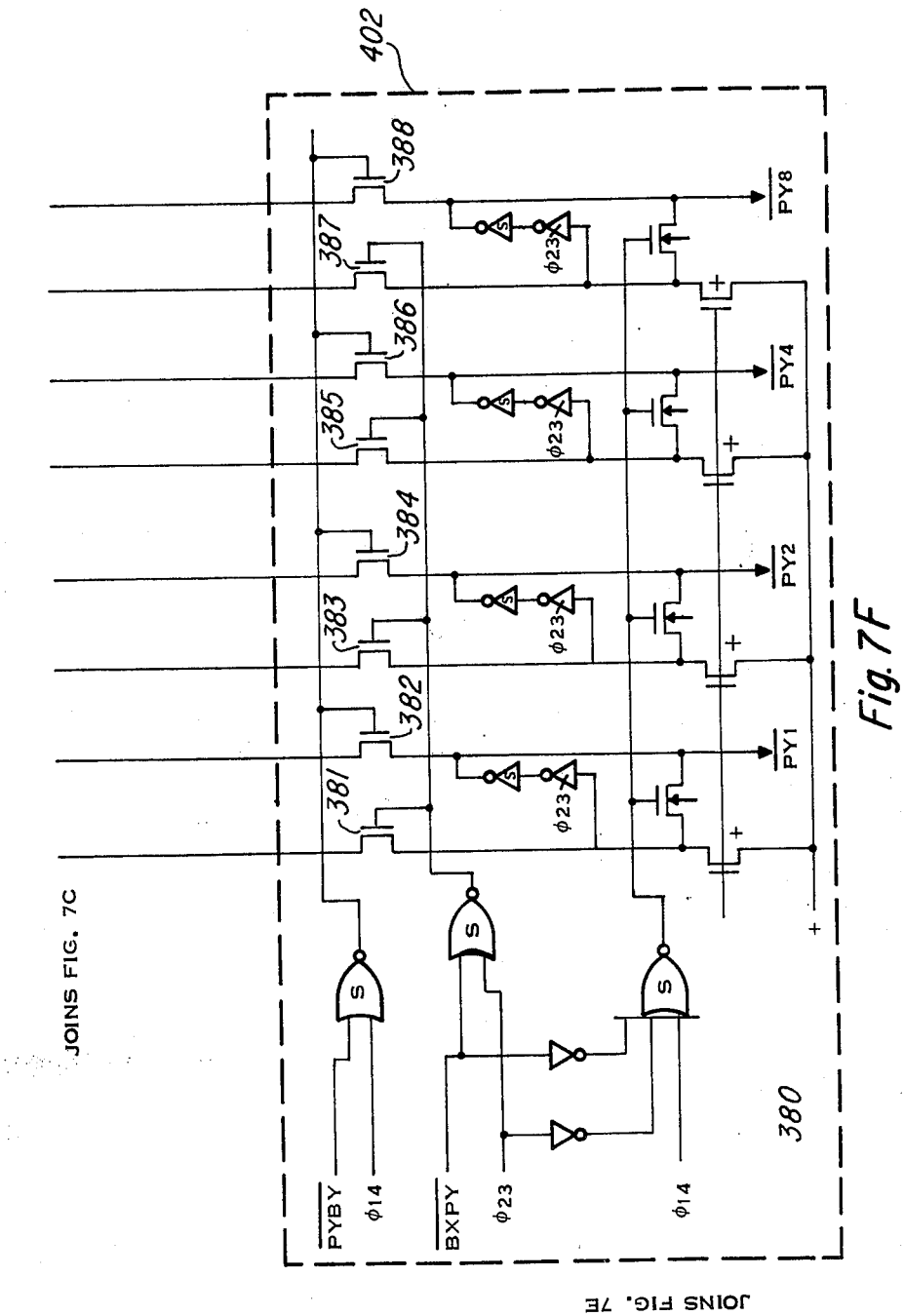

Referring to FIG. 7A, the dual bus feature of the present invention is shown. When microcode signal DB goes low, transistors 341 are switched off, thereby splitting (decoupling) the left side of the buses (providing isolation between the buses on each side of the bus splitting circuit from the right side of the buses, thereby isolating the ALU 115 and the pointer PZ from the pointers PX and PY and the RAM 110. This effectively creates an additional data bus and allows separate operations to be performed on each side of the bus splitting circuit 340.

The dual bus configuration with three memory pointers provides faster and more efficient transfer of data by enabling access to two different RAM locations (X, Z) and (Y,Z) and provides for transferring of eight bits of data from the ROM 125 to the RAM 110 and between ALU 115 and RAM 110, as well as between other logic blocks coupled to the dual bus means, during a single instruction cycle. Table 2 lists the microcode signals used to control the transfer of data signals between the ROM 125, the RAM 110, the ALU 115, and other logic blocks, via the dual bus.

Referring to FIG. 8, the clock timing waveforms for a preferred embodiment of the dual bus multiple pointer system is shown.

The clock timing waveform of FIG. 8 to wit, $\phi 11$, $\phi 13$, $\phi 14$, $\phi 21$, $\phi 22$, $\phi 23$, and $\phi 24$ comprises in total a single clock cycle. Referring to FIG. 9, a state mapping diagram referenced to the clock phases of FIGS. 8 shows the mapped dual bus tranfer functions and multiple pointer functions as mapped against functional blocks of the system of FIGS. 5-6.

Figure 10C:
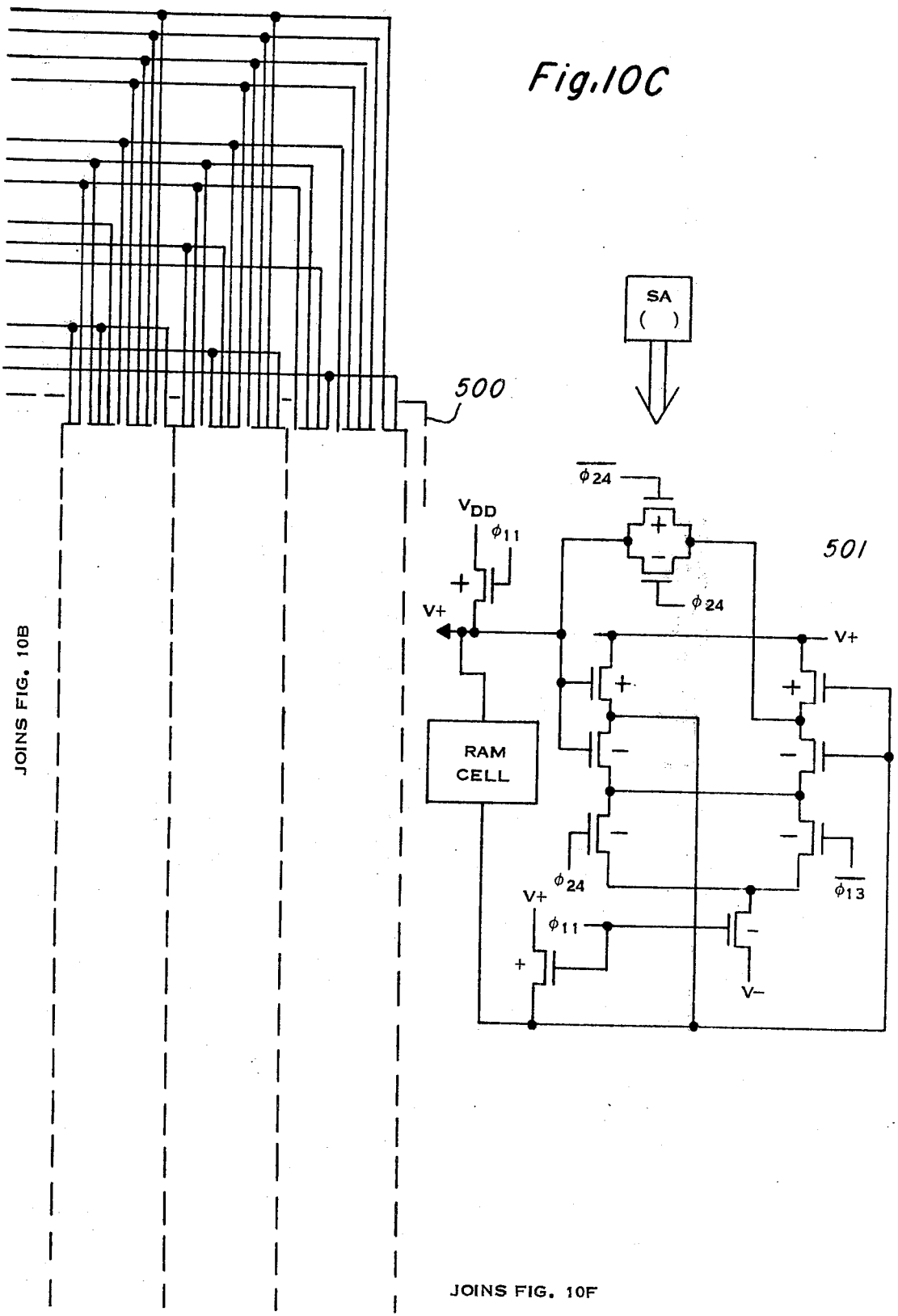
Figure 10D:
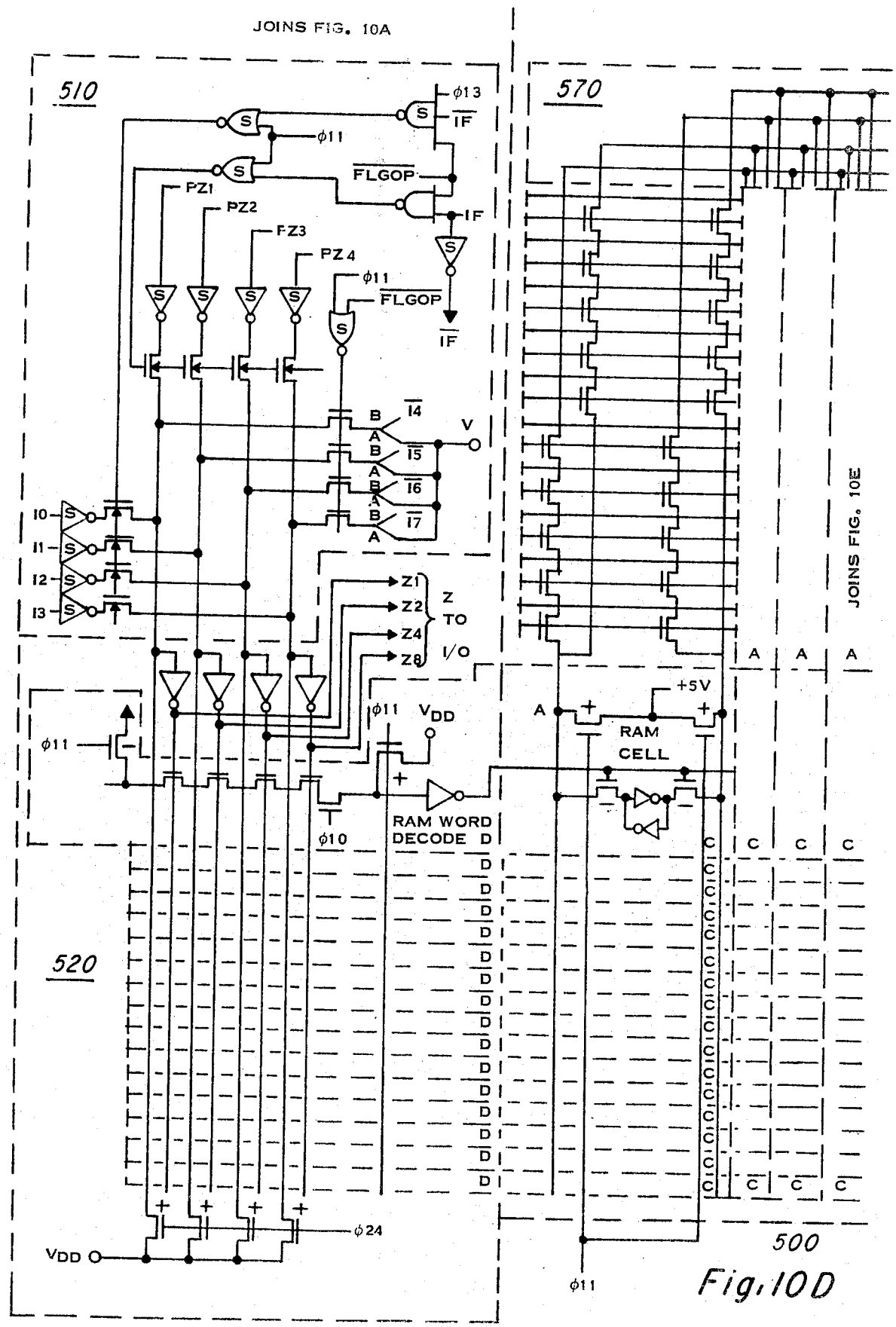
Figure 10E:
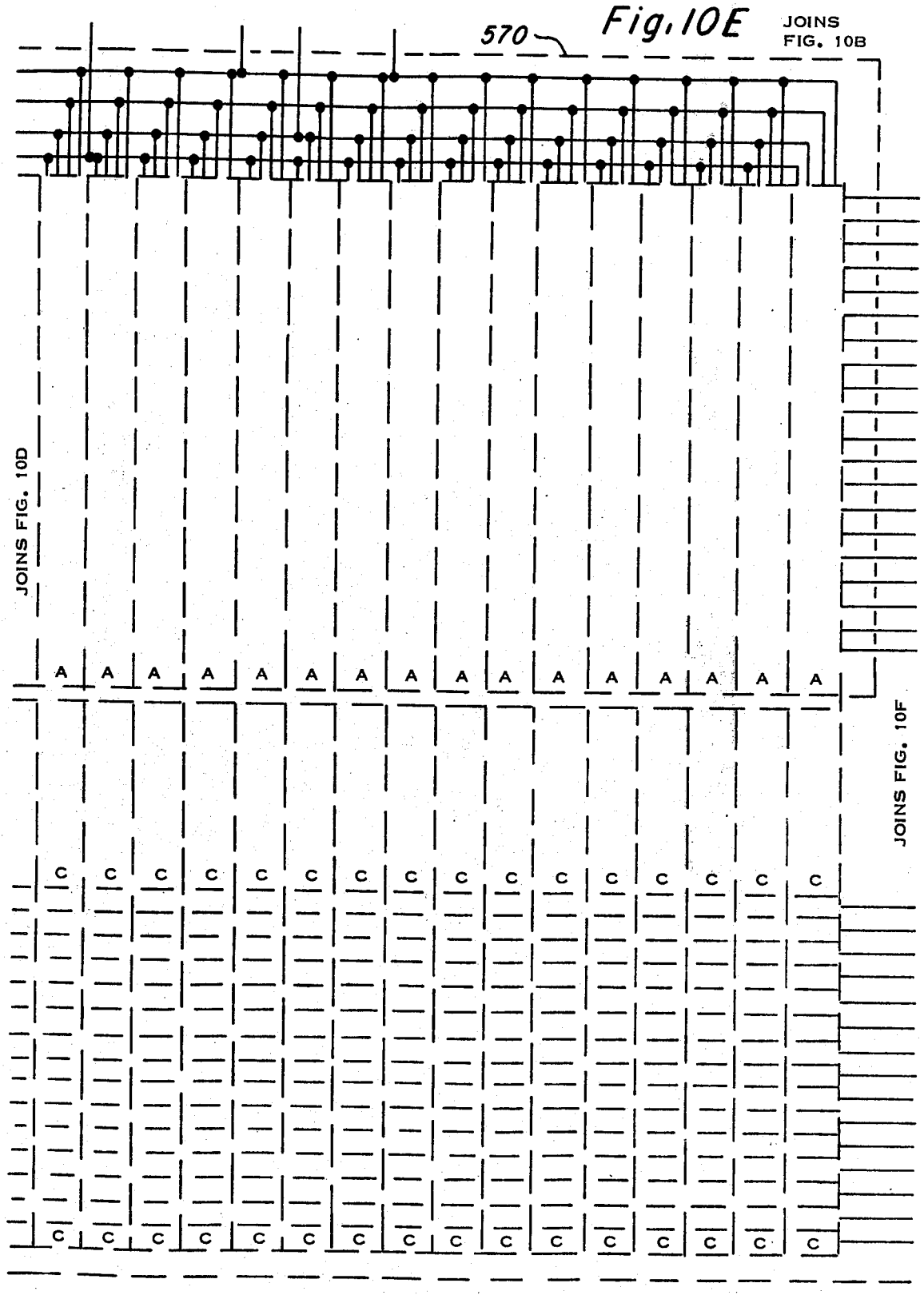
Figure 10G:
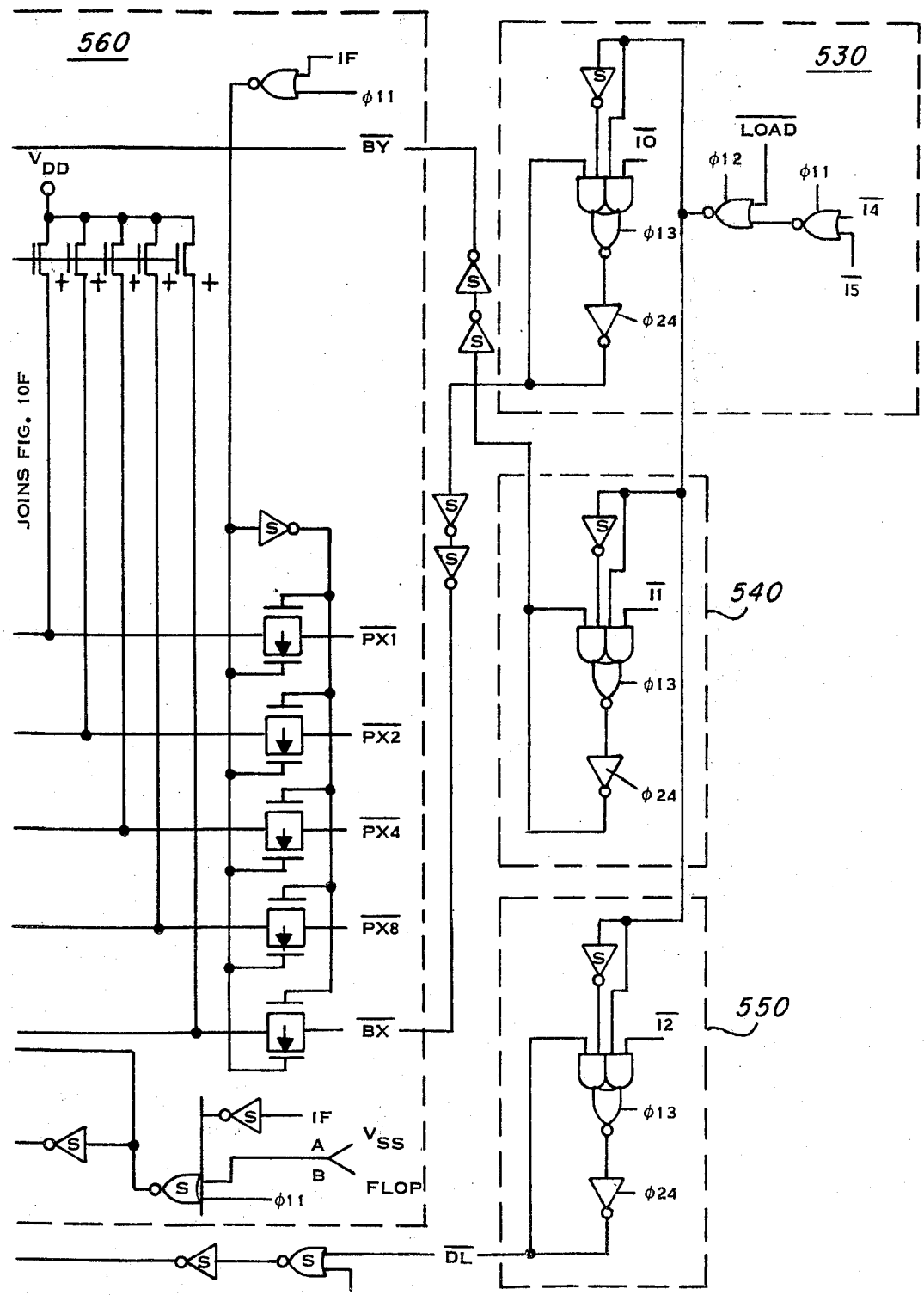

Referring to FIGS. 10A to 10G, the bus control logic 390 (FIGS. 10A and 10B), the RAM array 500 (FIGS. 10A to 10F); the digit latch 520 (FIG. 10D), the Z multiplexer 510 (FIG. 10c), associated logic (FIG. 10D), X multiplexer 560 (FIGS. 10F and 10G) and I/O logic 530, 540, and 550 (FIG. 10G) are shown in detailed schematic form corresponding to the functional blocks of FIGS. 5-6. FIG. 10C shows one embodiment of a detailed schematic of the RAM cell and associated logic 501 of the memory array 500 of FIGS. 10A–10F and FIG. 6.

Referring to FIG. 11, an electronic portable calculator of the type which may employ features of this invention is illustrated in pictoral form. The calculator 401 includes the keyboard 402 and the display 403. Display 403, in the preferred embodiment, consists of 16 alpha-numeric characters, each displayed by liquid crystal display devices, an array of light emitting diodes, a vacuum florescent tube display, or other display means. The display is preferably implemented having complete alpha-numeric display capability so as to be capable of displaying English language messages as well as permitting the display of data in scientific notation, or other output formats. Of course, the type of display and the number of digits displayed is a design choice. The display may be of the 7 segment, 8 segment, 9 segment, 13 segment, or 5×7 dot matric display character, depending on the character display flexibility desired. In a preferred embodiment, a 5×7 dot matrix per character position is utilized to allow for complete alpha-numeric and special character display. A keyboard 402, or other input means, preferably includes a set of number keys (0–9), a decimal point key, a plurality of function command keys including, for example, exponential, logarithmic, trigonometric and hierarcy functions. The expotential and logarithmetic function command keys include, for example, $X^2$, $\sqrt{X}X^2$, log X, lnX, yx, and $\sqrt[y]{X}$. The trigonometric functions include, for instance, the sine, cosine, functions, and their inverses, the hyperbolic sine, hyperbolic cosine, and hyperbolic tangent functions, and inverse hyperbolic functions. Other function command keys include store (STO), and recall (RCL) keys for respectively storing and recalling a number stored in one of the memory registers. An enter exponent key (EE) allows exponent entry of the number displayed in scientific notation. A +/− key is provided for changing the sign of the display number. An exchange key (X:Y) is provided for exchanging operator and operand of an arithmetic function. More conventional function command keys may be provided, including the clear key (C), the clear entry key (CE) and addition (+), subtraction (−), multiplication (×), division (÷), and equal (=) keys. Other function keys, in a preferred embodiment, include alpha-numeric variable keys (A-Z), parenthesis keys, hierarchy control keys, label key (LBL), and programmable feature function keys. The calculator is further provided with OP code keys for performing special functions such as slope, intercept, plotting operations, alpha-numeric operations, operating system hierarchy interface control and the like.

Referring to FIG. 12, a bottom view of the calculator 401 of FIG. 11 is shown. The placement of major components in a preferred embodiment of the calculator of FIG. 401 is shown. Controller integrated circuit chips 410, 411, and 412 provide the intelligence and control capabilities of the calculator system. Read/write memory 415, and read only memory 413, provide additional base system data storage beyond that provided on the controller chips 410, 411, and 412. A power supply 414 provides all necessary working voltages to the remainder of the calculator system's electronic components. The controller devices 410, 411 and 412, the read/write memory 415, the read only memory 413, and the power supply 414 are mounted to a main printed circuit board 416 within a calculator case 417. Additionally, compartments 420 and 421 within the calculator case 417 are coupled to the main printed circuit board 416 to allow for interconnection of plug-in memory modules 422 and 423 for interconnection to the controller chips 410, 411 and 412.

Referring to FIG. 13, a side view of the calculator system of FIGS. 11 and 12 is shown, detailing the relative placement of the controller chips 410, 411 and 412, the display 403, the keyboard 402, printed circuit board 416, and the memory modules 422 and 423, within the calculator case housing 417.

Referring to FIGS. 14A-C block diagrams of alternate embodiments of a modular system design of the present invention are shown. Referring to FIGS. 14A-B, modular controller 30 includes at least one controller integrated circuit 431 having modular bar size, modular bar I/O, and on bar functional modularity interchangeability within the integrated circuit 431. The controller 430 provides the central processing capability of the modular system. The controller 430 may comprise a single modular integrated circuit controller 431, or a plurality of modular integrated circuit controllers 431 interactively forming the controller 430. In a preferred embodiment, each modular integrated circuit controller 431 comprises fixed logic including data processing logic, instruction decode, and other processing and decoding logic functions; modular input and modular output interface circuits; and partitionable blocks of modular memory including read/write memory and read only memory. The controller 430 is coupled to display interface 440, to system memory 450, to external input stimulus 460, and to external peripheral 470. The display interface 440 may be comprise cascadeable display drivers including a master driver and at least one slave driver, as described in greater detail in co-pending application Ser. No. 168,853, entitled "A Data Processing System Having Dual Output Modes" by Test et al, filed July 14, 1980. Each display driver, master and slave, individually controls sectional blocks of characters of the display 480. The display 480 may comprise audible and/or visual representation of a received display signal. Alternatively, the display interface 440 may be included within the controller means 430. The display interface 440 is coupled to the display 480 for providing communications to and power for the display 480. The controller 430, in a preferred embodiment, communicates only with the master display driver 441, with the master display driver 441 cascading an output to provide communication to the slave display drivers 442, thereby providing for uniform and simplified controller 430 to display 480 interface, irrespective of the number of characters in the display 480. The system memory 450 provides additional data storage capability for the controller 430. In a preferred embodiment, the system memory 450 includes individual modules of read/write and read only memory, such as the read/write memory 415, read only memory 413 and the plug-in memory 422 and 423 as described with reference to FIG. 12. A common communication bus 435 couples the controller 430 to the read/write and read only memory of the system memory 450, as described in greater detail in copending application Ser. No. 154,335, entitled "Modular Integrated Circuit" by Brantingham et al, filed May 29, 1980. The external stimulus 460 may comprise a keyboard input, an external digital data storage medium such as magnetic tape, card, or disk, or a digital communication system such as a modem. The external peripheral 470 provides for communication from the controller 430 to the ultimate user. The external peripheral 470 may include a hard copy printer. A video display, or may alternatively provide for non-volatile date storage.

Referring to FIG. 14C, a block diagram of an alternative embodiment of the modular system of the present invention is shown. The block diagram of FIG. 14C is similar to that of FIG. 14B except that in the alternative embodiment the controller 430 and memory 450 are different than those shown in FIG. 14B. The controller 430 includes a universal algorithm controller 432 coupled to the keyboard input 460, the printer 470, and the display driver 440. The display driver 440 couples to the display 480. Alternatively, the display driver 440 is included within the universal algorithm controller integrated circuit 432. Furthermore, the universal algorithm controller 432 is coupled to a product definition ROM 452 in the memory 450. Additonally, the universal algorithm controller 432 may be coupled to additional RAM or ROM memories within the memory 450, either as a fixed part of the calculator system, or as plug in memories, as described with reference to FIGS. 12-13. The universal algorithm controlled embodiment is described in greater detail in copending application Ser. No. 154,554, entitled "Electronic Data Processing System" by Hunter, filed May 29, 1980, assigned to the assignee of the present invention.

While the present invention has been disclosed with respect to particular embodiments, it is understood by those skilled in the art that the present invention may be utilized in other embodiments, systems, circuits, and technologies, within the spirit of the present invention as set forth in the appended claims.

What is claimed is:
1. A memory system comprising:
   a memory means for selectively storing and outputting data words in a plurality of memory locations in response to a received address signal indicative of a particular one of said memory locations;

a selection means for generating a particular one of a set of select signals; and a plurality of address pointer registers coupled to said memory means and to said selection means each address pointer register for storing an address signal therein capable of addressing at least two locations anywhere in said memory means in response to receiving a corresponding select signal.

2. A memory system according to claim 1 wherein the corresponding select signals causes said at least two memory locations to be addressed simultaneously.

3. A memory system comprising:

a memory means having an X by Y matrix of the product of X and Y memory locations for storing and outputting data words in said memory locations in response to a received address signal corresponding to a particular one of said memory locations;

a selection means for generating a particular one of a set of selection signals;

a first pointer register means coupled to said selection means including a plurality of first address pointer registers, each first address pointer register for storing a first address coordinate therein, said first pointer register for outputting a first address coordinate stored in a selected one of said first address pointer registers in response to receiving a particular first select signal;

a second pointer register means coupled to said selection means for storing therein a second address coordinate and outputting said second address coordinate in response to receiving a second select signal such that the first address coordinates from said first pointer registers when combined with the second address coordinate from said second pointer register means produces at least two address signals which can address at least two locations anywhere in said memory means.

4. A memory system as claimed in claim 3 wherein:
said first address pointer registers are X-pointers and said second pointer register means is a Y-pointer.

5. A memory system as claimed in claim 3, wherein:
said first address pointer registers are Y-pointers and said second pointer register means is an X-pointer.

6. A memory system as claimed in claim 3, wherein:
said second pointer register means further includes a plurality of second address pointer registers, each second address pointer register for storing a second address coordinate therein, said second pointer means further including means for outputting the second address coordinate stored in a selected one of said second address pointer registers in response to a corresponding second select signal.

7. A memory system as claimed in claim 3 further comprising:

an input means for providing an input signal;

a processor means for performing data processing functions and for generating a display signal responsive to said input signal and said data words output from said memory means; and an output means for providing a humanly perceptable output indication responsive to said display signal.

8. A memory system as claimed in claim 3 further comprising:

a bus means for providing a first coupling path and a second coupling path;

a controller means for outputting first and second bus control signals;

means for coupling a selected one of said first and second pointer register means to said first coupling path in response to said first bus control signal; and means for coupling a selected one of said first and second pointer register means to said second coupling path in response to said second bus control signal.

* * * * *